(12) United States Patent
Elsherbini et al.

(10) Patent No.: US 11,916,006 B2
(45) Date of Patent: *Feb. 27, 2024

(54) MICROELECTRONIC ASSEMBLIES HAVING AN INTEGRATED VOLTAGE REGULATOR CHIPLET

(71) Applicant: Intel Corporation, Santa Clara, CA (US)

(72) Inventors: Adel A. Elsherbini, Chandler, AZ (US); Kaladhar Radhakrishnan, Chandler, AZ (US); Krishna Bharath, Phoenix, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/822,200

(22) Filed: Aug. 25, 2022

(65) Prior Publication Data

US 2022/0406701 A1    Dec. 22, 2022

Related U.S. Application Data

(62) Division of application No. 16/145,059, filed on Sep. 27, 2018, now Pat. No. 11,462,463.

(51) Int. Cl.
*H01L 23/498*   (2006.01)
*G05F 1/46*   (2006.01)
(Continued)

(52) U.S. Cl.
CPC .......... *H01L 23/49838* (2013.01); *G05F 1/46* (2013.01); *H01L 23/5226* (2013.01);
(Continued)

(58) Field of Classification Search
CPC .......... H01L 23/49838; H01L 23/5226; H01L 23/642; H01L 23/645; H01L 24/17;
(Continued)

(56) References Cited

U.S. PATENT DOCUMENTS

2004/0184219 A1*   9/2004   Otsuka .............. H01L 23/49805
257/E23.079
2008/0002380 A1*   1/2008   Hazucha .............. H01L 23/645
361/760

(Continued)

*Primary Examiner* — Duy T Nguyen
(74) *Attorney, Agent, or Firm* — Akona IP PC

(57) ABSTRACT

Microelectronic assemblies, related devices and methods, are disclosed herein. In some embodiments, a microelectronic assembly may include a package substrate having a surface; a die having a first surface and an opposing second surface; and a chiplet having a first surface and an opposing second surface, wherein the chiplet is between the surface of the package substrate and the first surface of the die, wherein the first surface of the chiplet is coupled to the surface of the package substrate and the second surface of the chiplet is coupled to the first surface of the die, and wherein the chiplet includes: a capacitor at the first surface; and an element at the second surface, wherein the element includes a switching transistor or a diode.

7 Claims, 17 Drawing Sheets

(51) Int. Cl.
  *H01L 23/00* (2006.01)
  *H01L 23/522* (2006.01)
  *H01L 23/64* (2006.01)
  *H01L 49/02* (2006.01)
  *H01F 27/24* (2006.01)

(52) U.S. Cl.
  CPC .......... *H01L 23/642* (2013.01); *H01L 23/645* (2013.01); *H01L 24/17* (2013.01); *H01L 28/10* (2013.01); *H01L 28/40* (2013.01); *H01F 27/24* (2013.01)

(58) Field of Classification Search
  CPC ......... H01L 28/10; H01L 28/40; H01L 24/02; H01L 24/06; H01L 24/11; H01L 24/13; H01L 24/16; H01L 24/29; H01L 24/32; H01L 24/03; H01L 24/05; H01L 24/81; H01L 24/83; H01L 24/94; H01L 2224/0233; H01L 2224/03002; H01L 2224/0345; H01L 2224/03462; H01L 2224/03464; H01L 2224/0347; H01L 2224/0391; H01L 2224/0401; H01L 2224/05624; H01L 2224/05639; H01L 2224/05644; H01L 2224/05647; H01L 2224/05655; H01L 2224/06102; H01L 2224/06181; H01L 2224/11002; H01L 2224/11334; H01L 2224/1145; H01L 2224/1146; H01L 2224/11462; H01L 2224/11464; H01L 2224/1147; H01L 2224/13013; H01L 2224/13014; H01L 2224/13022; H01L 2224/131; H01L 2224/13105; H01L 2224/13109; H01L 2224/13111; H01L 2224/13124; H01L 2224/13139; H01L 2224/13144; H01L 2224/13147; H01L 2224/13155; H01L 2224/16145; H01L 2224/16146; H01L 2224/16227; H01L 2224/16235; H01L 2224/17051; H01L 2224/81191; H01L 2224/81815; H01L 2924/15153; H01L 2924/19103; H01L 2924/19104; H01L 2924/3512; H01L 2924/381; H01L 2924/3841; H01L 25/16; H01L 23/13; H01L 23/50; H01L 23/5383; H01L 2224/04105; H01L 2224/1703; H01L 2224/17181; H01L 2224/2919; H01L 2224/32145; H01L 2224/32225; H01L 2224/73204; H01L 2224/81895; H01L 2224/83101; H01L 2224/83102; H01L 2224/94; G05F 1/46; H01F 27/24
  USPC ........................................................ 257/724
  See application file for complete search history.

(56) References Cited

U.S. PATENT DOCUMENTS

| | | | |
|---|---|---|---|
| 2009/0322414 A1* | 12/2009 | Oraw | H02M 3/07 327/537 |
| 2011/0068433 A1* | 3/2011 | Kim | H01L 23/645 257/659 |
| 2016/0043068 A1* | 2/2016 | Ramachandran | H01L 27/0255 257/532 |
| 2016/0190113 A1* | 6/2016 | Sharan | H01L 21/78 257/532 |

* cited by examiner

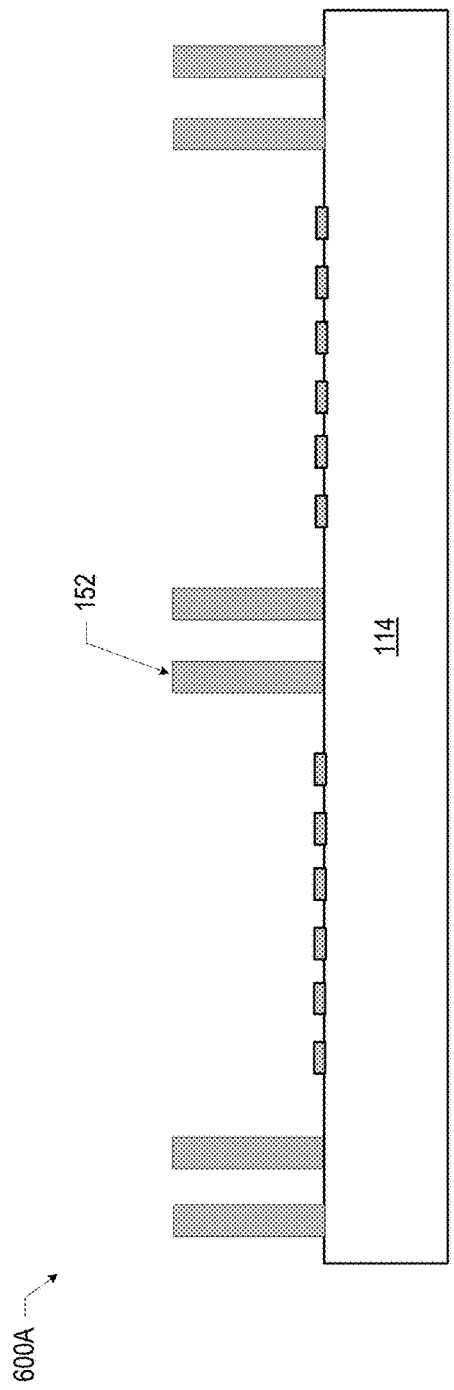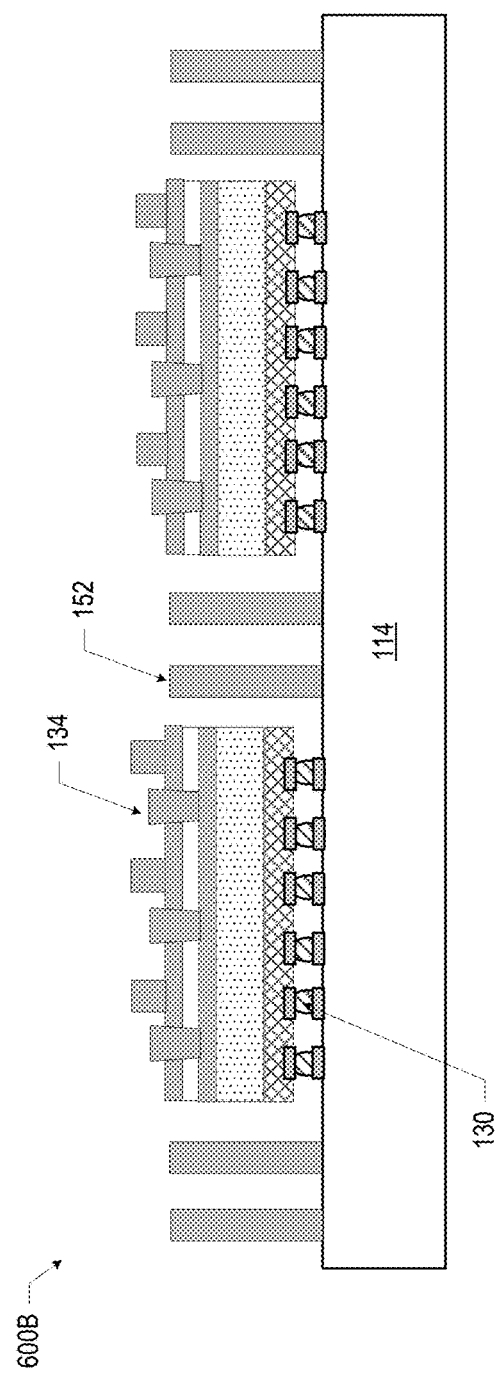

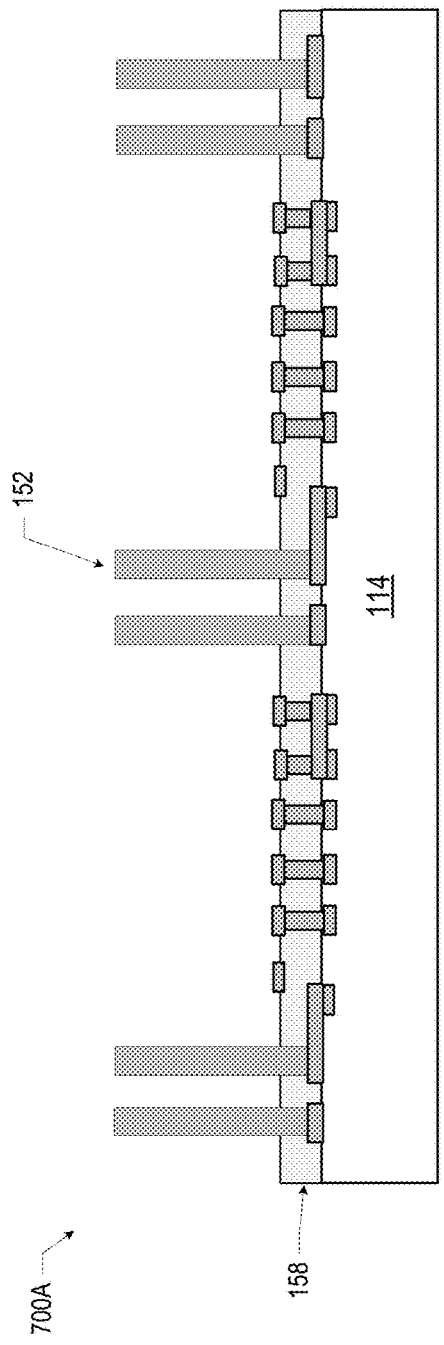
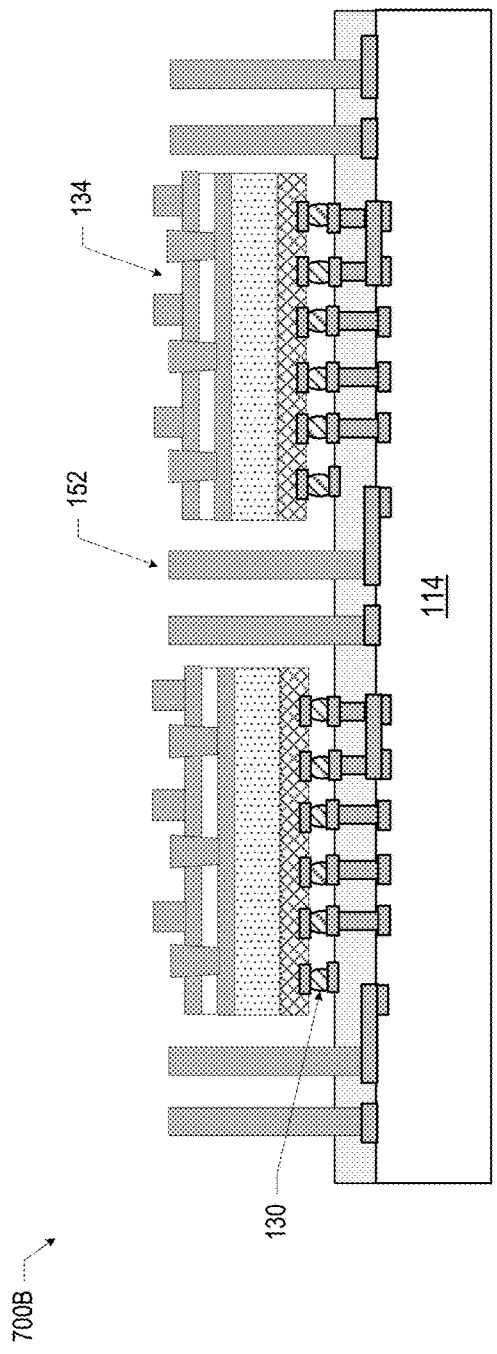
FIG. 7A
FIG. 7B

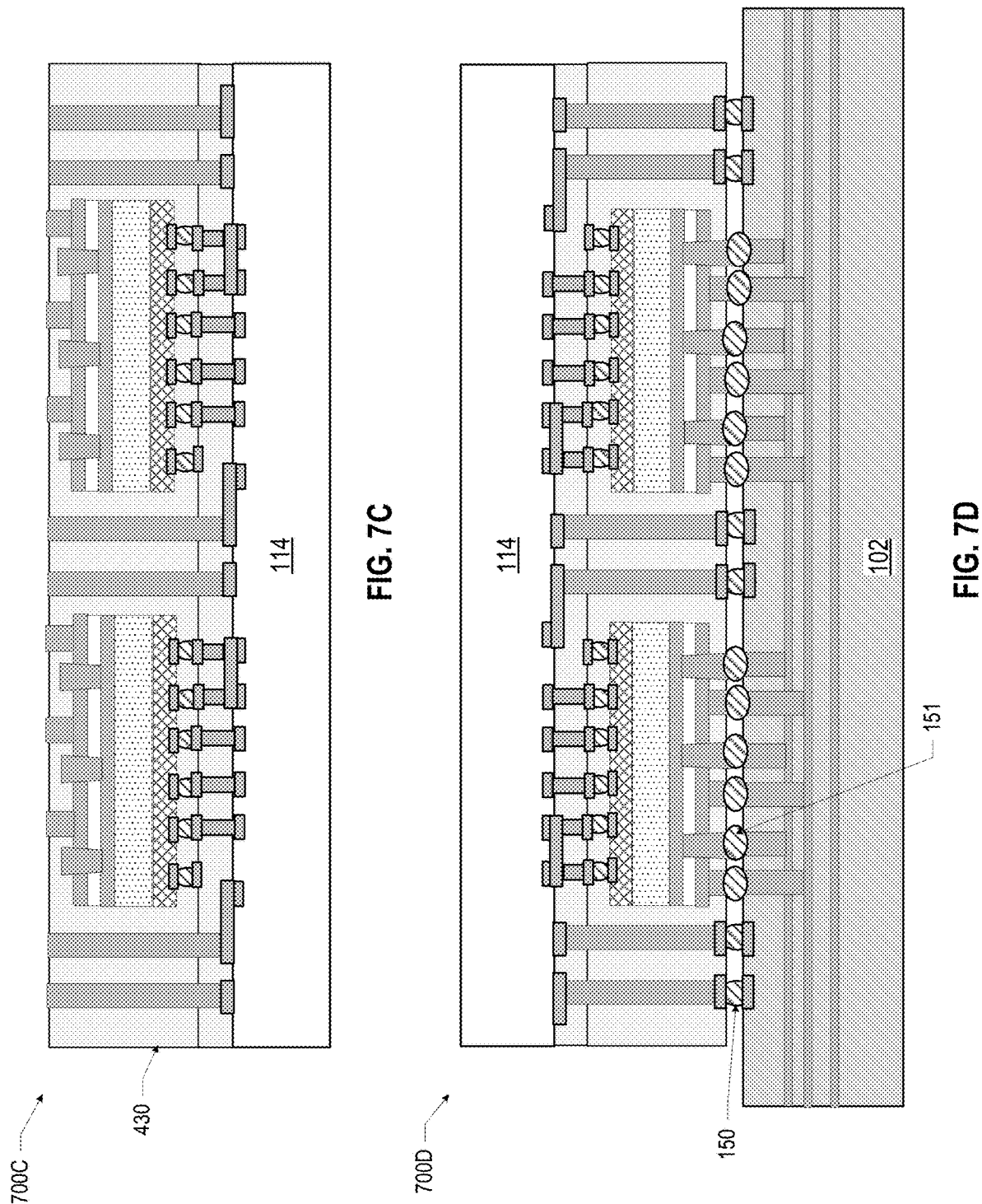

MICROELECTRONIC ASSEMBLIES HAVING AN INTEGRATED VOLTAGE REGULATOR CHIPLET

CROSS-REFERENCE TO RELATED APPLICATION

This application is a divisional of (and claims the benefit of priority under 35 U.S.C. § 120 to) U.S. patent application Ser. No. 16/145,059, filed Sep. 27, 2018, now U.S. Pat. No. 11,462,463, and entitled "MICROELECTRONIC ASSEMBLIES HAVING AN INTEGRATED VOLTAGE REGULATOR CHIPLET," which is hereby incorporated by reference herein in its entirety.

BACKGROUND

Integrated circuit (IC) packages may include an integrated voltage regulator (IVR) within an IC die for managing power delivery to the IC die. Conventional IVRs may include the same logic transistor technology for analog circuits and digital circuits, which prevents the IVR from being scalable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 6A-6C are side, cross-sectional views of various stages in an example process for manufacturing the microelectronic assembly of FIG. 1A, in accordance with various embodiments.

FIGS. 7A-7D are side, cross-sectional views of various stages in an example process for manufacturing the microelectronic assembly of FIG. 4A, in accordance with various embodiments.

DETAILED DESCRIPTION

Figure 1A:
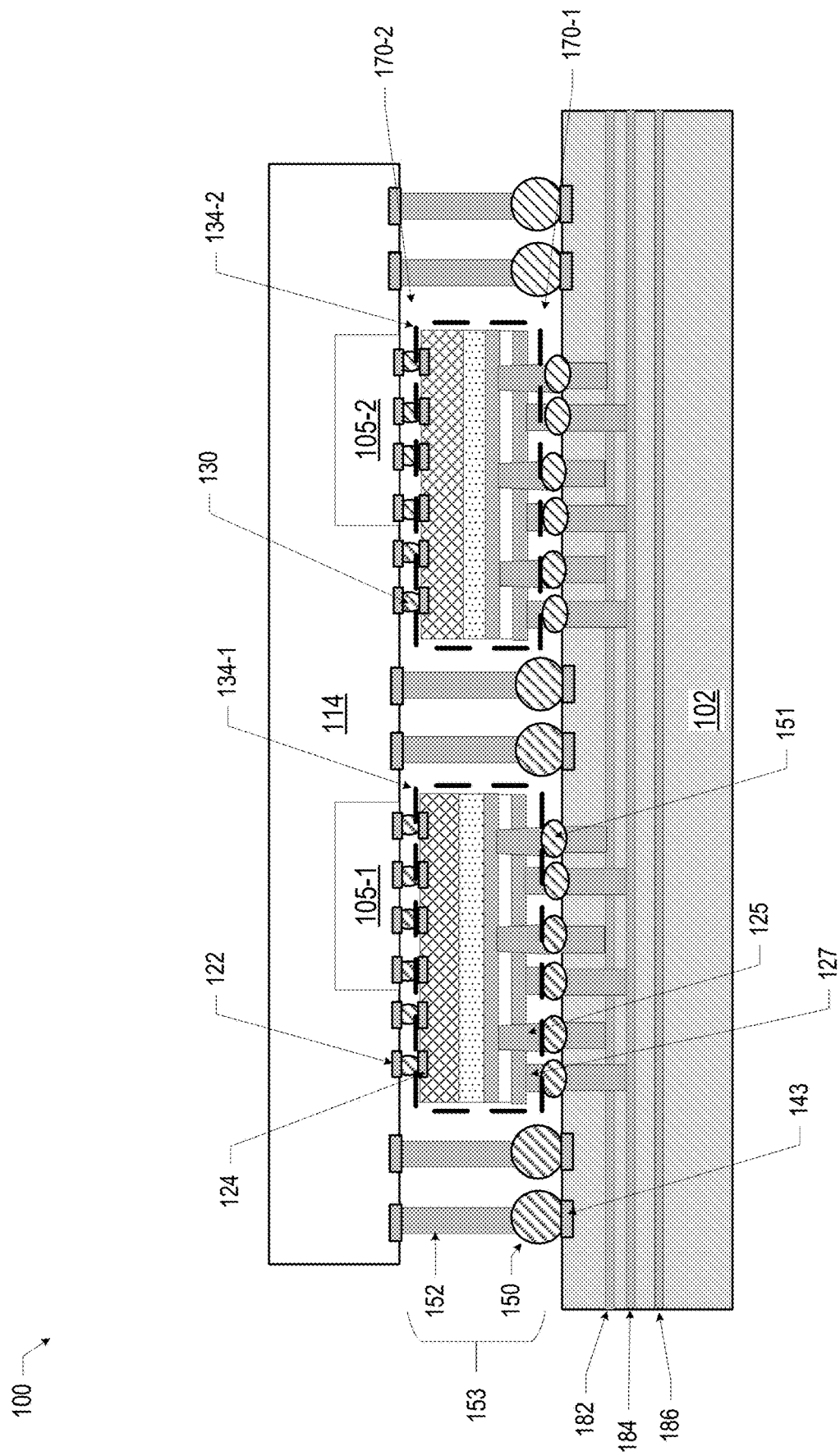
FIG. 1A is a side, cross-sectional view of an example microelectronic assembly, in accordance with various embodiments.

Microelectronic assemblies, related devices and methods, are disclosed herein. In some embodiments, a microelectronic assembly may include a package substrate having a surface; a die having a first surface and an opposing second surface; and a chiplet having a first surface and an opposing second surface, wherein the chiplet is between the surface of the package substrate and the first surface of the die, wherein the first surface of the chiplet is coupled to the surface of the package substrate and the second surface of the chiplet is coupled to the first surface of the die, and wherein the chiplet includes: a capacitor at the first surface; and an element at the second surface, wherein the element includes a switching transistor or a diode.

Communicating large numbers of signals in a multi-die IC package is challenging due to the increasingly small size of such dies and power delivery constraints, among others. IVRs are commonly used in electronics and communications applications to regulate voltage for power delivery. Conventional IVRs, such as buck regulators, typically include a voltage input, a voltage output, an input capacitor, an output capacitor, an inductor, a switching transistor and/or a diode, and a control circuit having a plurality of transistors to perform voltage regulation and to control the switching transistor and/or diode. A conventional fully integrated voltage regulator (FIVR) is commonly implemented as part of a main die, which increases the die area, and typically includes a combination of analog and digital circuits. Since analog circuits (e.g., analog transistors) may not scale (e.g., may not be reduced in size), a conventional FIVR may not scale as the other on-die logic circuits scale such that, as a size of the die decreases, the overall area associated with the FIVR increases relative to the size of the die. The overall area associated with a FIVR increases further, when an IC package includes multiple FIVRs. For example, an IC package may include multiple dies having multiple cores and multiple FIVRs associated with each die and/or each core, where each FIVR regulates power delivery at a same or different voltage/frequency. Various ones of the embodiments disclosed herein may improve IC package performance with greater design flexibility, at a lower cost, and/or with a reduced size relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 5" may be used to refer to the collection of drawings of FIGS. 5A-5F, the phrase "FIG. 6" may be used to refer to the collection of drawings of FIGS. 6A-6C, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1A is a side, cross-sectional view of a microelectronic assembly 100, in accordance with various embodiments. A microelectronic assembly 100 may include one or more chiplets 134-1, 134-2 having IVR components and circuitry coupled to a die 114 and a package substrate 102. As used herein, a chiplet may refer to a die having an area (e.g., length times width) between 0.5 square millimeter ($mm^2$) and 20 $mm^2$, such that a footprint of a chiplet may be smaller than a footprint of a die, and, when stacked, a footprint of a chiplet may be wholly within a footprint of a die. In particular, the chiplet 134 may be coupled to a package substrate 102 on a bottom surface (e.g., first surface 170-1) and coupled to a die 114 on a top surface (e.g., second surface 170-2), where the chiplet 134 is between the package substrate 102 and the die 114. The die 114 may include one or more cores 105-1, 105-2. As used herein, a core may refer to a processing unit that executes program instructions for general processing, graphics processing, or general machine learning. As used herein, the terms "core," "processing core," and "graphics core" may be used interchangeably.

As shown in FIG. 1A, an individual core 105-1, 105-2 may be associated with an individual chiplet 134-1, 134-2, respectively, such that, the chiplet 134 may regulate voltage for the associated core 105. As described below with reference to FIG. 3, in some embodiments, a chiplet 134 may be associated with multiple cores. In some embodiments, a chiplet 134 may regulate voltage and provide power to other active areas of a die 114 as well as to the cores 105. The package substrate 102 may include a power plane, which may include an input voltage 182 and an output voltage 186, and a ground plane 184. The power plane may be a high voltage power plane, a low voltage power plane, or a high/low power plane where the input voltage is a high voltage and the output voltage is a low voltage. As used herein, a power plane may refer to a conductive structure that transmits power and may refer to a conductive planar structure or may refer to a linear conductive structure (e.g., a corridor). As used herein, a ground plane may refer to a conductive structure that connects to ground and may refer to a conductive planar structure or may refer to a linear conductive structure (e.g., a corridor). The conductive contacts 122 on a bottom surface of the die 114 may be coupled to conductive contacts 143 on a top surface of the package substrate 102 via extended die-to-package-substrate (DTPS) interconnects 153. The extended DTPS interconnects 153 may include first level interconnects (FLIs) 150 and a conductive pillar 152 or conductive bumps. In some embodiments, the FLIs 150 may have a pitch between 10 microns and 800 microns (e.g., between 80 microns and 500 microns). Power, ground, and/or signals may be transmitted between the package substrate 102 and the die 114 by the extended DTPS interconnects 153 and other conductive pathways. The die 114 may be coupled to the chiplet 134 via die-to-chiplet (DTC) interconnects 130. In particular, conductive contacts 122 on a bottom surface of the die 114 may be coupled to conductive contacts 124 on a top surface of chiplet 134 by DTC interconnects 130. Conductive contacts 125 on a bottom surface of the chiplet 134 may be coupled to an input power plane 182 in the package substrate 102 and conductive contacts 127 on a bottom surface of the chiplet 134 may be coupled to a ground plane 184 in the package substrate 102 via chiplet-to-package-substrate (CTPS) interconnects 151.

Figure 1B:
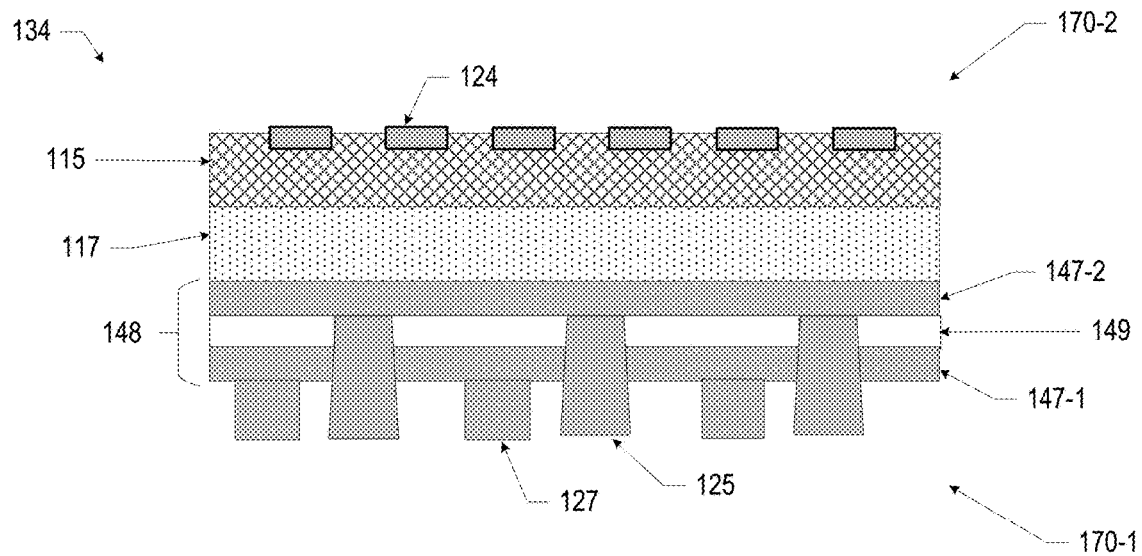
FIG. 1B is a magnified portion of FIG. 1A, in accordance with various embodiments.

FIG. 1B is a magnified portion of the chiplet 134 of FIG. 1A, in accordance with various embodiments. In particular, the chiplet 134 may include a capacitor layer 148 on a first surface 170-1, an active layer 115 on a second surface 170-2, and a non-electrical layer 117 (e.g., an inactive layer) between the capacitor layer 148 and the active layer 115. The capacitor layer 148 may include a first metal layer 147-1, a dielectric layer 149, and a second metal layer 147-2 to form a metal-insulator-metal (MIM) capacitor. The capacitor layer 148 may function as an input capacitor 144, as described in FIG. 2. In some embodiments, the capacitor layer 148 may include multiple capacitor layers to form a multi-layer capacitor. The chiplet 134 may further include additional IVR components, for example, a switching transistor integrated on the active layer 115 of the chiplet 134. In some embodiments, the switching transistor may be replaced with a diode. In some embodiments, an active layer 115 of a chiplet 134 may include a switching transistor and a diode. In some embodiments, an active layer 115 of a chiplet 134 may include at least two switching transistors.

A chiplet 134 disclosed herein may include an active layer 115 having an insulating material (e.g., a dielectric material formed in multiple layers, as known in the art) and multiple conductive pathways formed through the insulating material. In some embodiments, the insulating material of a chiplet 134 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the chiplet 134 may include a semiconductor material, such as silicon, germanium, or an III-V material (e.g., gallium nitride, gallium arsenide, or indium phosphide), and one or more additional materials. The semiconductor material may be used to form the active layer of the chiplet as well as the active layer devices such as the switching transistors, the diodes, additional logic devices, among others. The conductive pathways in a chiplet 134 may include conductive traces and/or conductive vias, and may connect any of the conductive contacts in the chiplet 134 in any suitable manner. A chiplet 134 may have any suitable dimensions. In some embodiments, a chiplet may have an area (e.g., length times width) between 0.5 square millimeter (mm$^2$) and 20 mm$^2$. In some embodiments, a chiplet may have a height (e.g., z-height or thickness) between 20 microns and 200 microns.

A die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). The die 114 may include a semiconductor material, such as silicon, germanium, or a III-V material (e.g., gallium nitride, gallium arsenide, or indium phosphide), and one or more additional materials. The semiconductor material may be used to form the active devices within the die 114, such as transistors, and diodes, etc. The conductive pathways in a die 114 may include conductive traces and/or conductive vias, and may connect any of the conductive contacts in the die 114 in any suitable manner. Example structures that may be included in the chiplets 134 and the dies 114 disclosed herein are discussed below with reference to FIG. 9. The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked). A die 114 may have any suitable dimensions. In some embodiments, a die may have an area between 30 mm$^2$ and 1600 mm$^2$.

Although FIG. 1A shows a particular arrangement of a microelectronic assembly 100 including a two chiplets 134 and a single die 114 having two cores 105, a microelectronic assembly 100 may include any number and arrangement of chiplets 134, dies 114 and cores 105. For example, a die 114 may be one of a plurality of dies in a composite die. In another example, a die 114 may include any number of cores, and may include more than one or two cores, where an individual chiplet 134 is associated with one or more cores 105. In some embodiments, a microelectronic assembly 100 may include multiple dies 114 having multiple cores 105. In some embodiments, a microelectronic assembly may have one hundred or more cores 105 and one hundred or more chiplets 134.

The package substrate 102 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), bismaleimide-triazine (BT) resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier by laminating or spinning on a dielectric material, and creating conductive vias and lines by laser drilling and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein. In other embodiments, the package substrate may be a silicon or glass interposer.

In some embodiments, the package substrate 102 may be a lower density medium and the die 114 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

The DTC interconnects 130 disclosed herein may take any suitable form. The DTC interconnects 130 may have a finer pitch than the DTPS interconnects 153 or the CTPS interconnects 151 in a microelectronic assembly. In some embodiments, the DTC interconnects 130 may include small conductive bumps (e.g., copper bumps) attached to the conductive contacts 122, 124 by solder. In some embodiments, a set of DTC interconnects 130 may include solder. In some embodiments, a set of DTC interconnects 130 may include an anisotropic conductive material. In some embodiments, some or all of the DTC interconnects 130 may be metal-to-metal interconnects (e.g., copper-to-copper interconnects, or plated interconnects). In such embodiments, the conductive contacts 122, 124 on either side of the DTC interconnect 130 may be bonded together (e.g., under elevated pressure and/or temperature) without the use of intervening solder or an anisotropic conductive material. Any of the conductive contacts disclosed herein (e.g., the conductive contacts 122, 124, and/or 143) may include bond pads, solder bumps, conductive posts, or any other suitable conductive contact, for example. In some embodiments, some or all of the DTC interconnects 130 in a microelectronic assembly 100 may be solder interconnects that include a solder with a higher melting point than a solder included in some or all of the DTPS interconnects 153. For example, when the DTC interconnects 130 in a microelectronic assembly 100 are formed before the DTPS interconnects 153 are formed (e.g., as discussed below with reference to FIG. 6), solder-based DTC interconnects 130 may use a higher-temperature solder (e.g., with a melting point above 200 degrees Celsius), while the extended DTPS interconnects 153 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

The CTPS interconnects 151 disclosed herein may take any suitable form. In some embodiments, the CTPS interconnects 151 may include small conductive bumps (e.g., copper bumps) attached to the conductive contacts 125, 127 on the bottom surface of the chiplet 134 by solder. In some embodiments, a set of CTPS interconnects 151 may include solder. In some embodiments, a set of CTPS interconnects 151 may include an anisotropic conductive material. In some embodiments, some or all of the CTPS interconnects 151 may be metal-to-metal interconnects (e.g., copper-to-copper interconnects, or plated interconnects).

The extended DTPS interconnects 153 may take any suitable form, including, as described above, a FLI 150 and a conductive pillar 152. In some embodiments, a conductive pillar 152 may be replaced by a conductive bump. The FLIs 150 disclosed herein may take any suitable form. In some embodiments, the FLIs 150 may include solder (e.g., solder bumps or balls that are subject to a thermal reflow to form the interconnects). In some embodiments, the FLIs 150 may include an anisotropic conductive material, such as an anisotropic conductive film or an anisotropic conductive paste. An anisotropic conductive material may include conductive materials dispersed in a non-conductive material.

The conductive pillars 152 of the extended DTPS interconnects 153 may be formed of any appropriate conductive material, such as copper, silver, nickel, gold, aluminum, or other metals or alloys, for example. The conductive pillars 152 of the extended DTPS interconnects 153 may be formed using any suitable process, including, for example, the process described with reference to FIG. 6. In some embodiments, the conductive pillars 152 disclosed herein may have a pitch between 50 microns and 1000 microns. As used herein, pitch is measured center-to-center (e.g., from a center of a conductive pillar to a center of an adjacent conductive pillar). The conductive pillars 152 may have any suitable size and shape. In some embodiments, the conductive pillars 152 may have a circular, rectangular, or other shaped cross-section. In some embodiments, the conductive pillars 152 may have a thickness (e.g., z-height) between 50 microns and 1000 microns and a cross-section between 20 and 500 microns.

In the microelectronic assemblies 100 disclosed herein, some or all of the extended DTPS interconnects 153 may have a larger pitch than some or all of the DTC interconnects 130. DTC interconnects 130 may have a smaller pitch than the extended DTPS interconnects 153 due to the greater similarity of materials in the chiplet 134 and the die 114 than between the die 114 and the package substrate 102. In particular, the differences in the material composition of a die 114 and a package substrate 102 may result in differential expansion and contraction of the die 114 and the package substrate 102 due to heat generated during operation (as well as the heat applied during various manufacturing operations). To mitigate damage caused by this differential expansion and contraction (e.g., cracking, solder bridging, etc.), the extended DTPS interconnects 153 may be formed larger and farther apart than DTC interconnects 130, which may experience less thermal stress due to the greater material similarity of the chiplet 134 and the die 114 on either side of the DTC interconnects. In some embodiments, the extended DTPS interconnects 153 disclosed herein may have a pitch between 80 microns and 300 microns, while the extended DTC interconnects 130 disclosed herein may have a pitch between 5 microns and 100 microns.

The microelectronic assembly 100 of FIG. 1A may also include an underfill material (not shown). In some embodiments, the underfill material may extend between the chiplet 134, the die 114, and the package substrate 102, including around the associated CTPS interconnects 151 and DTPS interconnects 153. The underfill material may be an insulating material, such as an appropriate epoxy material. In some embodiments, the underfill material may include a capillary underfill, non-conductive film (NCF), or molded underfill. In some embodiments, the underfill material may include an epoxy flux. The underfill material may be selected to have a coefficient of thermal expansion (CTE) that may mitigate or minimize the stress between the chiplets 134 and the package substrate 102 arising from uneven thermal expansion in the microelectronic assembly 100. In some embodiments, the CTE of the underfill material may have a value that is intermediate to the CTE of the package substrate 102 (e.g., the CTE of the dielectric material of the package substrate 102) and a CTE of the chiplet 134.

The microelectronic assembly 100 of FIG. 1A may also include a circuit board (not shown). The package substrate 102 may be coupled to the circuit board by second-level interconnects at the bottom surface of the package substrate 102. The second-level interconnects may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, the second-level interconnects may not couple the package substrate 102 to a circuit board, but may instead couple the package substrate 102 to another IC package, an interposer, or any other suitable component. In some embodiments, the multi-layer die subassembly may not be coupled to a package substrate 102, but may instead be coupled to a circuit board, such as a PCB.

Many of the elements of the microelectronic assembly 100 of FIG. 1A are included in other ones of the accompanying figures; the discussion of these elements is not repeated when discussing these figures, and any of these elements may take any of the forms disclosed herein.

Figure 2A:
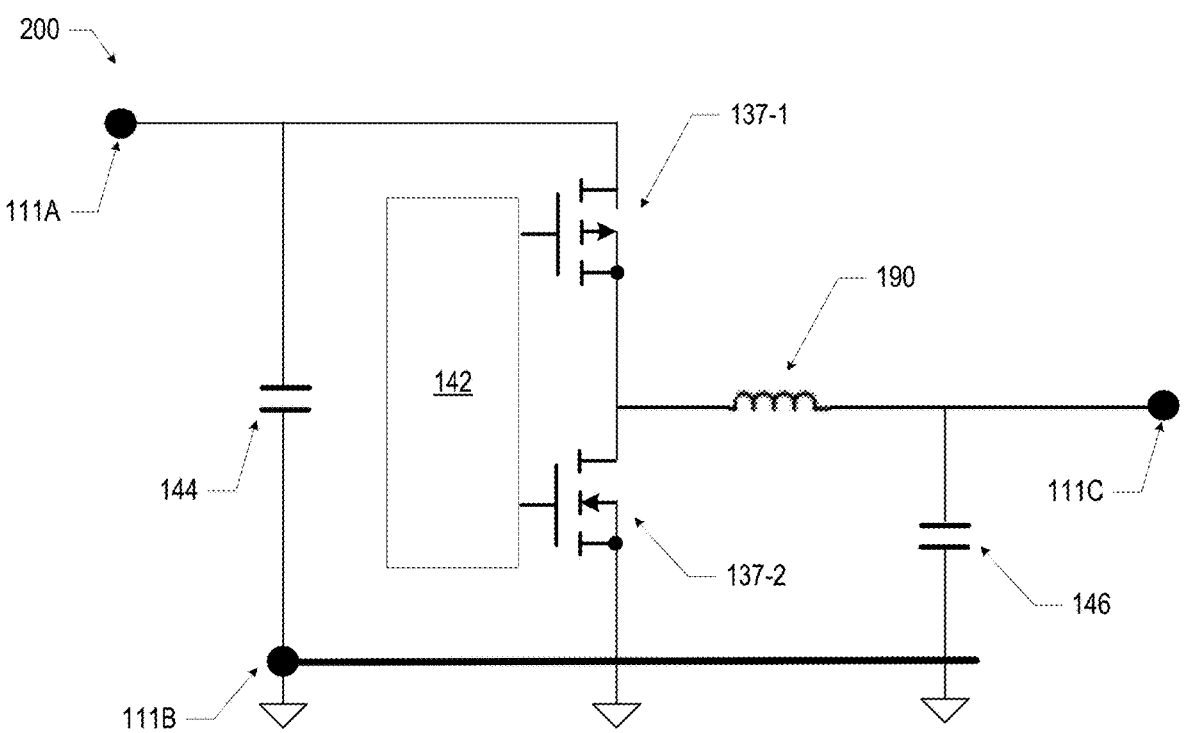
FIG. 2A is a simplified circuit diagram of an example IVR, in accordance with various embodiments.

FIG. 2A is a simplified circuit diagram of an example IVR 200 that may be included in a microelectronic assembly 100, in accordance with various embodiments. A typical IVR may be integrated on a die 114 and may include an input voltage 111A (e.g., high voltage supply), an input capacitor 144, an output capacitor 146, a control circuit 142 that controls a first switching transistor 137-1 and a second switching transistor 137-2, a ground connection 111B, an output voltage 111C, and an inductor 190. A switching transistor is a power transistor that acts as a switch that alternates between connecting the inductor terminal to the input voltage terminal and connecting the inductor terminal to the ground terminal to regulate voltage and provide regulated power to the microelectronic assembly. As shown in FIG. 2A, the first switching transistor 137-1 may be a p-type metal oxide semiconductor (PMOS) transistor and the second switching transistor 137-2 may be an n-type metal oxide semiconductor (NMOS) transistor. The architecture of IVR 200 may include three connections to power and ground, which are the input voltage 111A, the ground connection 111B, and the output voltage 111C, and may couple to the input power plane 182, the ground plane 184, and the output power plane 186 in the package substrate, respectively. In some embodiments, the IVR 200 further may be coupled to other external components, such as an additional inductor and/or capacitor (e.g., an inductor and/or a capacitor on the package substrate 102 or the die 114). In some embodiments, the IVR 200 may be a buck regulator. In some embodiments, the IVR 200 may include a buck-boost converter, a low dropout (LDO) regulator, or a power gate.

Figure 2B:
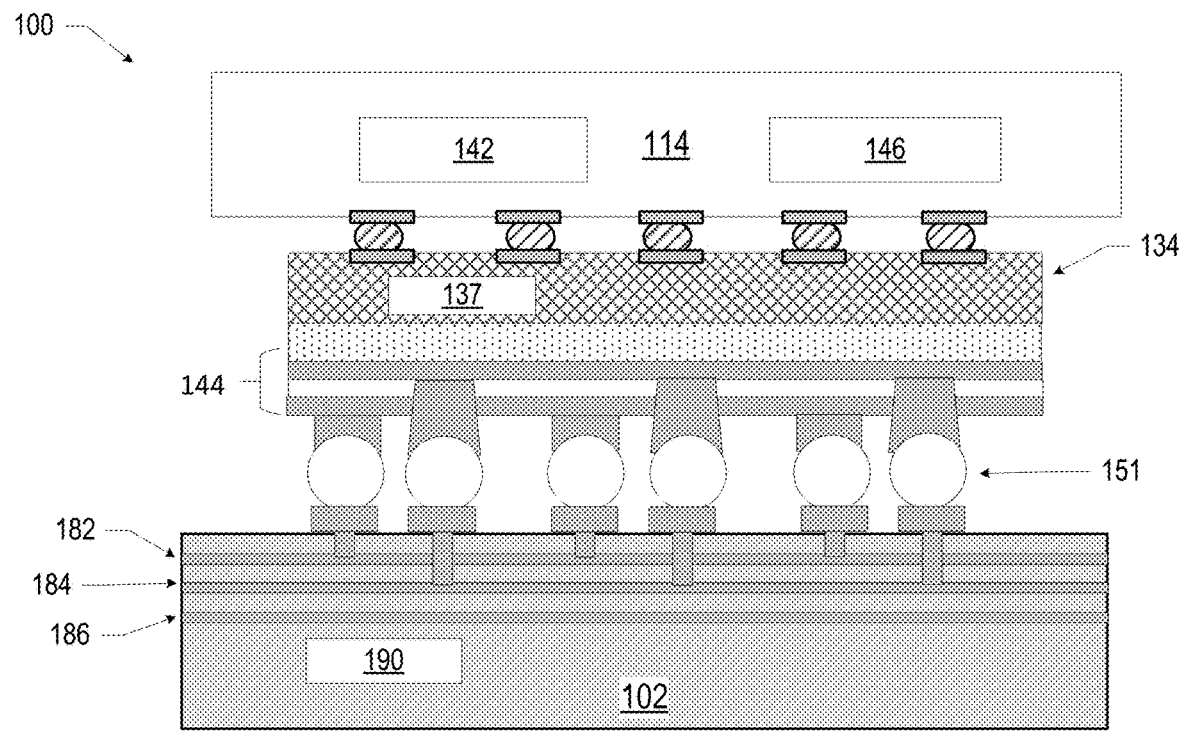
FIGS. 2B-2D are side, cross-sectional schematics showing example arrangements of IVR components in microelectronic assemblies, in accordance with various embodiments.

FIG. 2B is a side, cross-sectional schematic of a microelectronic assembly 100 showing an example arrangement of IVR components, in accordance with various embodiments. As shown in FIG. 2B, a microelectronic assembly 100 may include a die 114, a chiplet 134, and a package substrate 102. The die 114 may include a control circuit 142 and an output capacitor 146. The chiplet 134 may include an input capacitor 144 and a switching transistor 137. In some embodiments, a chiplet 134 may include one switching transistor 137. In some embodiments, a chiplet 134 may include at least two switching transistors 137. In some embodiments, a chiplet 134 may include a switching transistor 137 and a diode (not shown). The package substrate 102 may include an input power plane 182, a ground plane 184, an output power plane 186, and an inductor 190. In some embodiments, the inductor in the package substrate may be implemented as conductive loops within the package substrate, or may be manufactured as a subassembly, then embedded in the package substrate. The input capacitor 144 in the chiplet 134 may be coupled to the input power plane 182 and the ground plane 184 in the package substrate 102. A switching transistor 137 in the chiplet 134 may be coupled to the inductor 190 in the package substrate 102 via conductive pathways in the die 114 and via extended DTPS interconnects 153, as shown in FIG. 1A.

Figure 2C:
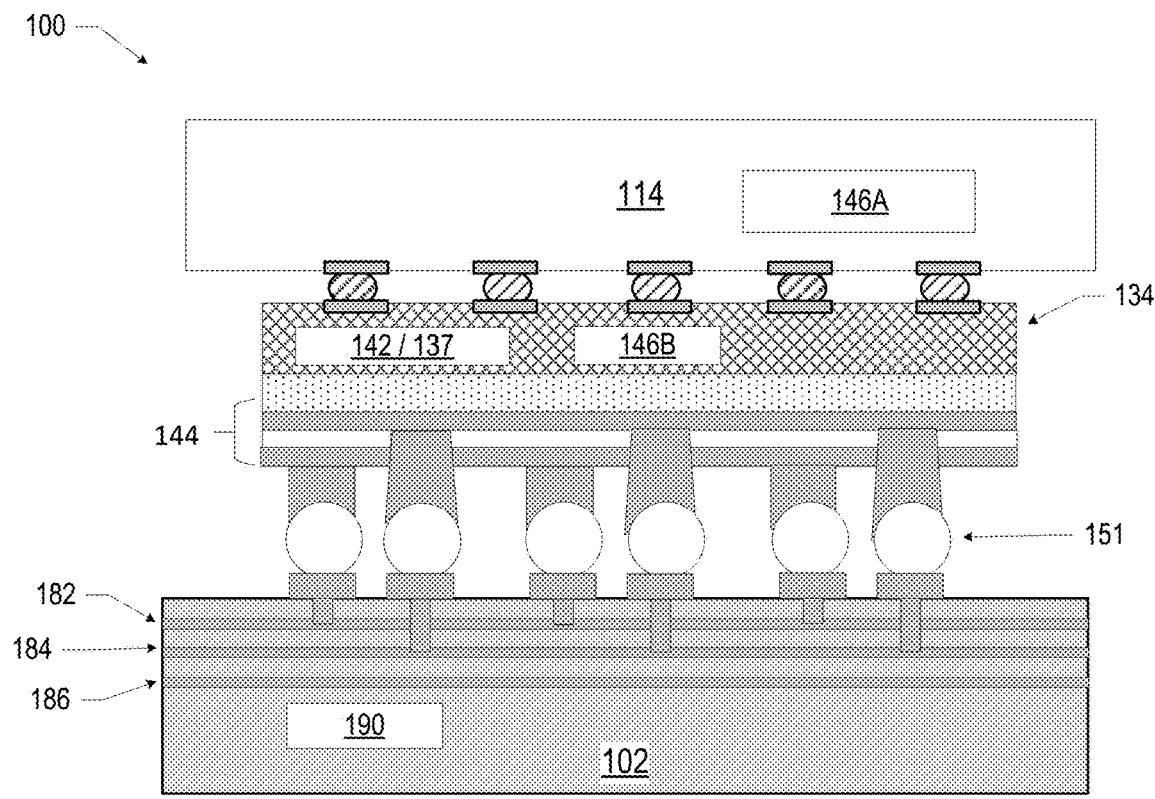

FIG. 2C is a side, cross-sectional schematic of a microelectronic assembly 100 showing another example arrangement of IVR components, in accordance with various embodiments. As shown in FIG. 2C, a microelectronic assembly 100 may include a die 114, a chiplet 134, and a package substrate 102. The die 114 may include an output capacitor 146A. The chiplet 134 may include an input capacitor 144, a switching transistor 137, a control circuit 142, and an output capacitor 146B. In some embodiments, when a chiplet includes two switching transistors, one of the two switching transistors 137 may be replaced by a diode. The package substrate 102 may include an input power plane 182, a ground plane 184, an output power plane 186, and an inductor 190. The input capacitor 144 in the chiplet 134 may be coupled to the input power plane 182 and the ground plane 184 in the package substrate 102. The switching transistor 137 in the chiplet 134 may be coupled to the inductor 190 in the package substrate 102 via conductive pathways in the die 114 and via extended DTPS interconnects 153, as shown in FIG. 1A. The output capacitor 146B in the chiplet 134 may be coupled to the output capacitor 146A in the die 114 via DTC interconnects 130, as shown in FIG. 1A.

Figure 2D:
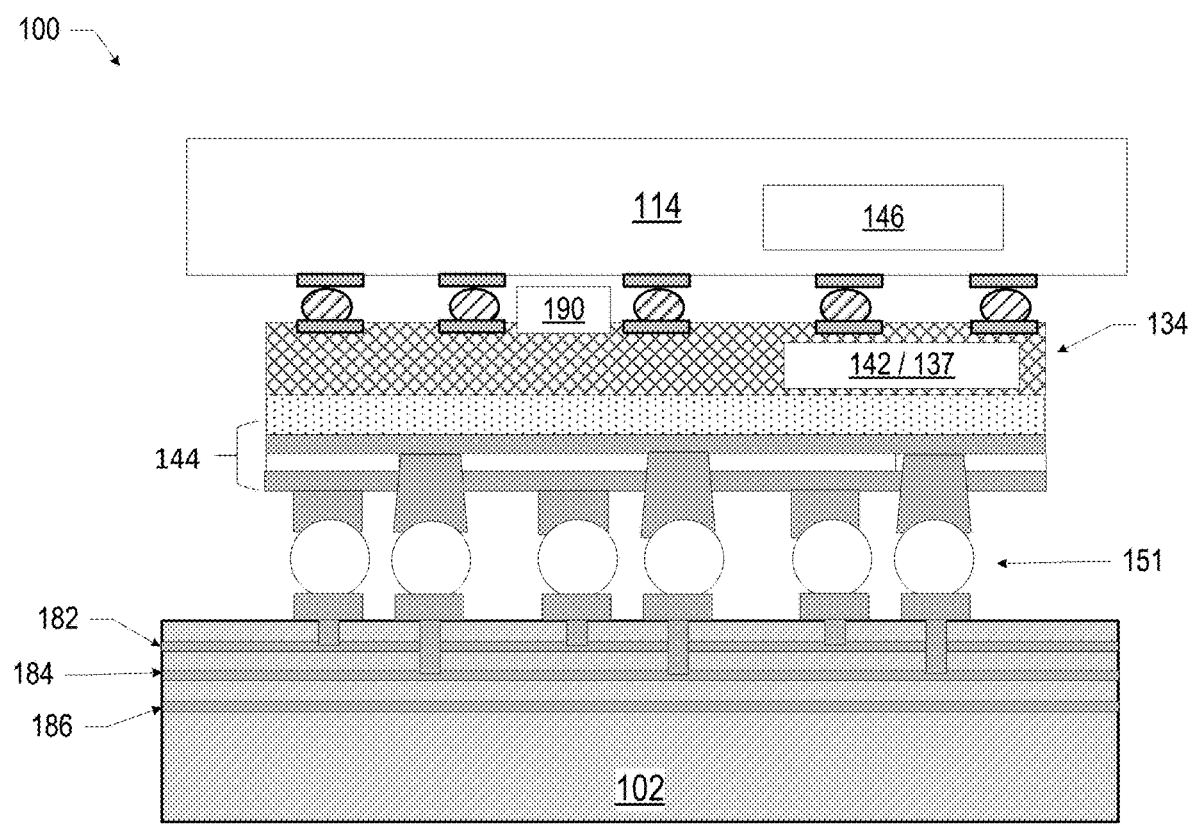

FIG. 2D is a side, cross-sectional schematic of a microelectronic assembly 100 showing another example arrangement of IVR components, in accordance with various embodiments. As shown in FIG. 2D, a microelectronic assembly 100 may include a die 114, a chiplet 134, and a package substrate 102. The die 114 may include an output capacitor 146. The chiplet 134 may include an input capacitor 144, a control circuit 142, a switching transistor 137, and an inductor 190. The inductor 190 may include any suitable inductor, such as a thin film magnetic core inductor. The package substrate 102 may include an input power plane 182, a ground plane 184, and an output power plane 186. The input capacitor 144 in the chiplet 134 may be coupled to the input power plane 182 and the ground plane 184 in the package substrate 102. The switching transistor 137 may be coupled to the inductor 190 via conductive pathways in the chiplet 134.

Figure 3A:
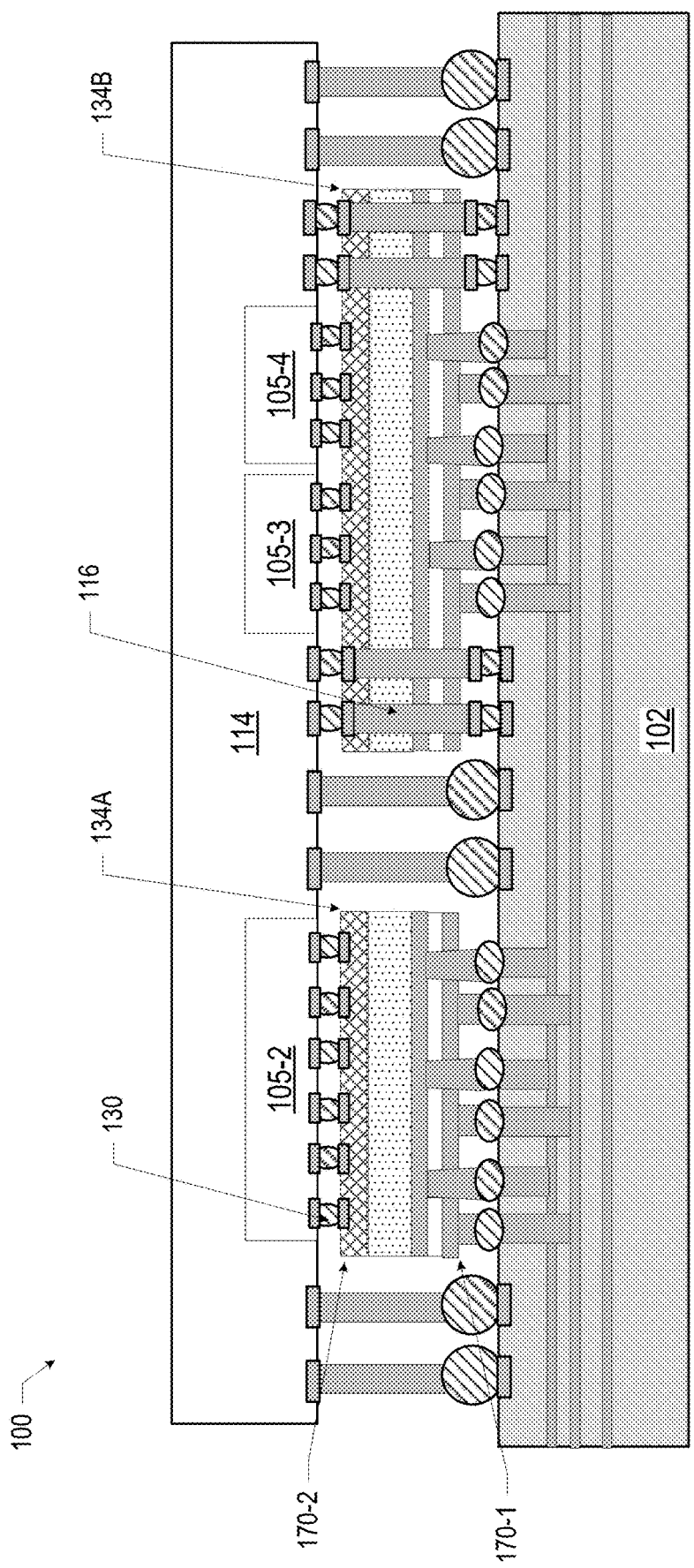
FIG. 3A is a side, cross-sectional view of an example microelectronic assembly, in accordance with various embodiments.

FIG. 3A is a side, cross-sectional view of another example microelectronic assembly 100, in accordance with various embodiments. Although FIG. 1 depicts a single chiplet associated with a single core, where a chiplet has a particular size and shape, a single chiplet may be associated with multiple cores, and a chiplet may have any suitable size and shape. As shown in FIG. 3A, a microelectronic assembly 100 may include a first chiplet 134-1 and a second chiplet 134-2 having IVR components coupled to a package substrate 102 on a first surface 170-1 and coupled to a die 114 on a second surface 170-2. The first chiplet 134-1 may be coupled to a core 105-2 in the die 114 via DTC interconnects 130. The second chiplet 134-2 may be coupled to multiple cores 105-3, 105-4 in the die 114 via DTC interconnects 130, and may include at least two IVRs where one IVR is associated with the core 105-3 and another IVR is associated with the core 105-4. In some embodiments, a single IVR may be used to power multiple cores. As shown in FIG. 3A, the chiplets 134 may have different sizes and shapes. For example, the second chiplet 134-2 may have a larger size as compared to the first chiplet 134-1. For example, a larger chiplet may be used for higher power portions of a die (e.g., core or graphics) and a smaller chiplet may be used for lower power portions of the die (e.g., input/output (I/O) circuits). The first chiplet and the second chiplet may have different shapes (e.g., the first chiplet may have a rectangular shape and the second chiplet may have a square or triangular shape). As shown in the second chiplet 134-2, a chiplet 134 may include through silicon vias (TSVs) 116 to directly couple the die 114 to the package substrate 102.

Figure 3B:
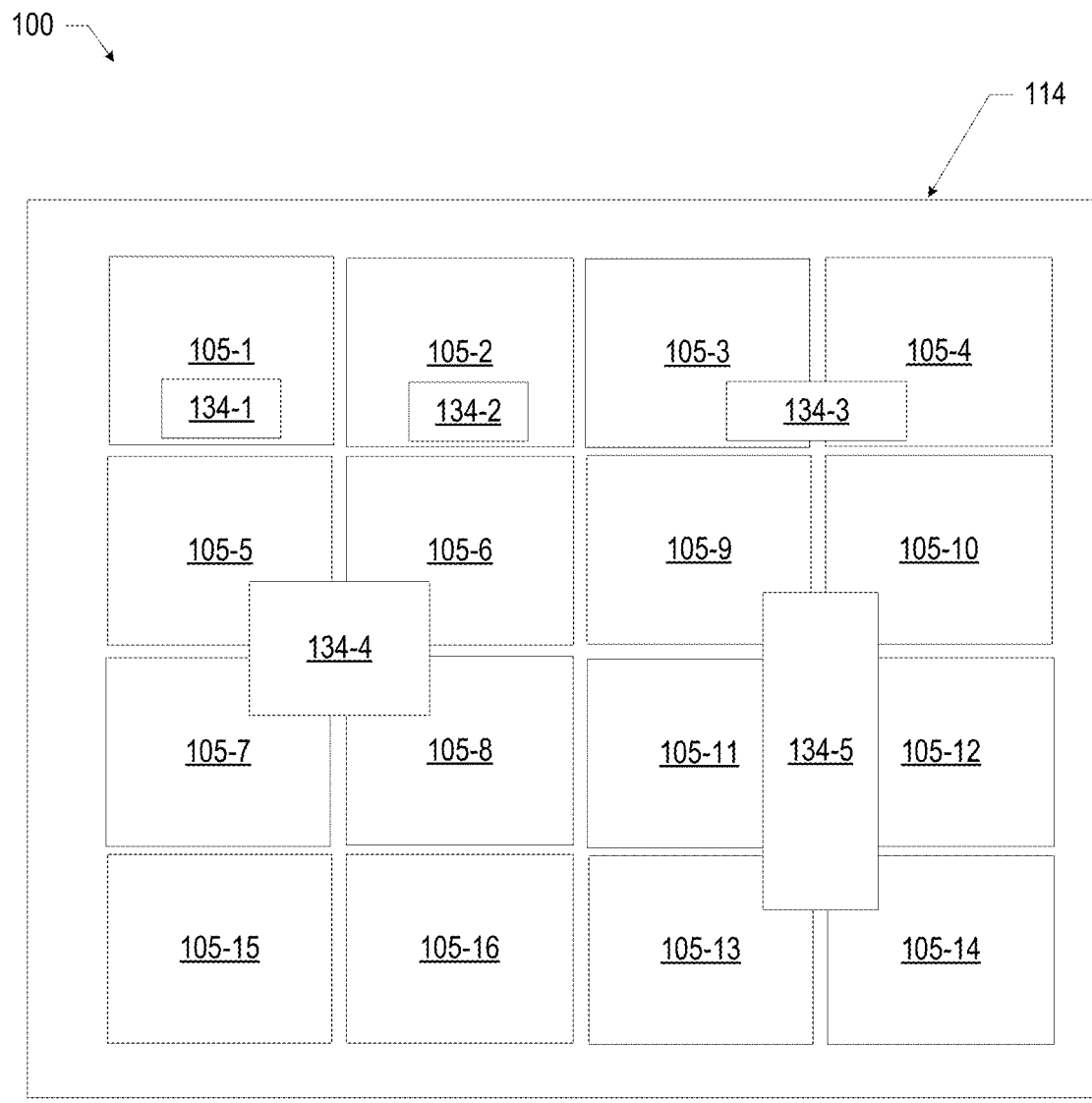
FIG. 3B is a bottom view of an example microelectronic assembly showing an example arrangement of cores and chiplets, in accordance with various embodiments.

FIG. 3B illustrates a bottom view arrangement of a microelectronic assembly 100 without the package substrate in which multiple chiplets 134 are disposed on multiple cores 105 of a die 114. The cores 105 may be the same cores (e.g., processor) or may be different cores (e.g., graphics and 10 circuits). FIG. 3B depicts a die 114 having sixteen cores 105-1-105-16 arranged in a rectangular array, and five chiplets associated with the cores. In particular, a first chiplet 134-1 may be associated with a first core 105-1, and a second chiplet 134-2 may be associated with a second core 105-2. A third chiplet 134-3 may be associated with two cores (e.g., a third core 105-3 and a fourth core 105-4). A fourth chiplet 134-4 may be associated with four cores (e.g., a fifth core 105-5, a sixth core 105-6, a seventh core 105-7, and an eighth core 105-8). A fifth chiplet 134-5 may be associated with six cores (e.g., a ninth core 105-9, a tenth core 105-10, an eleventh core 105-11, a twelfth core 105-12, a thirteenth core 105-13, and a fourteenth core 105-14). In some embodiments, a single chiplet may power multiple cores and may have multiple IVRs, where an individual IVR is coupled to or associated with an individual core. In some embodiments, a single chiplet may have a single IVR that is coupled to multiple cores. Although FIG. 3B illustrates the cores 105 as being arranged in a rectangular array, the cores 105 may be arranged in any suitable pattern. Although FIG. 3B illustrates the chiplets 134 as having a particular arrangement, these arrangements are simply exemplary, and any suitable arrangements may be used.

Figure 4A:
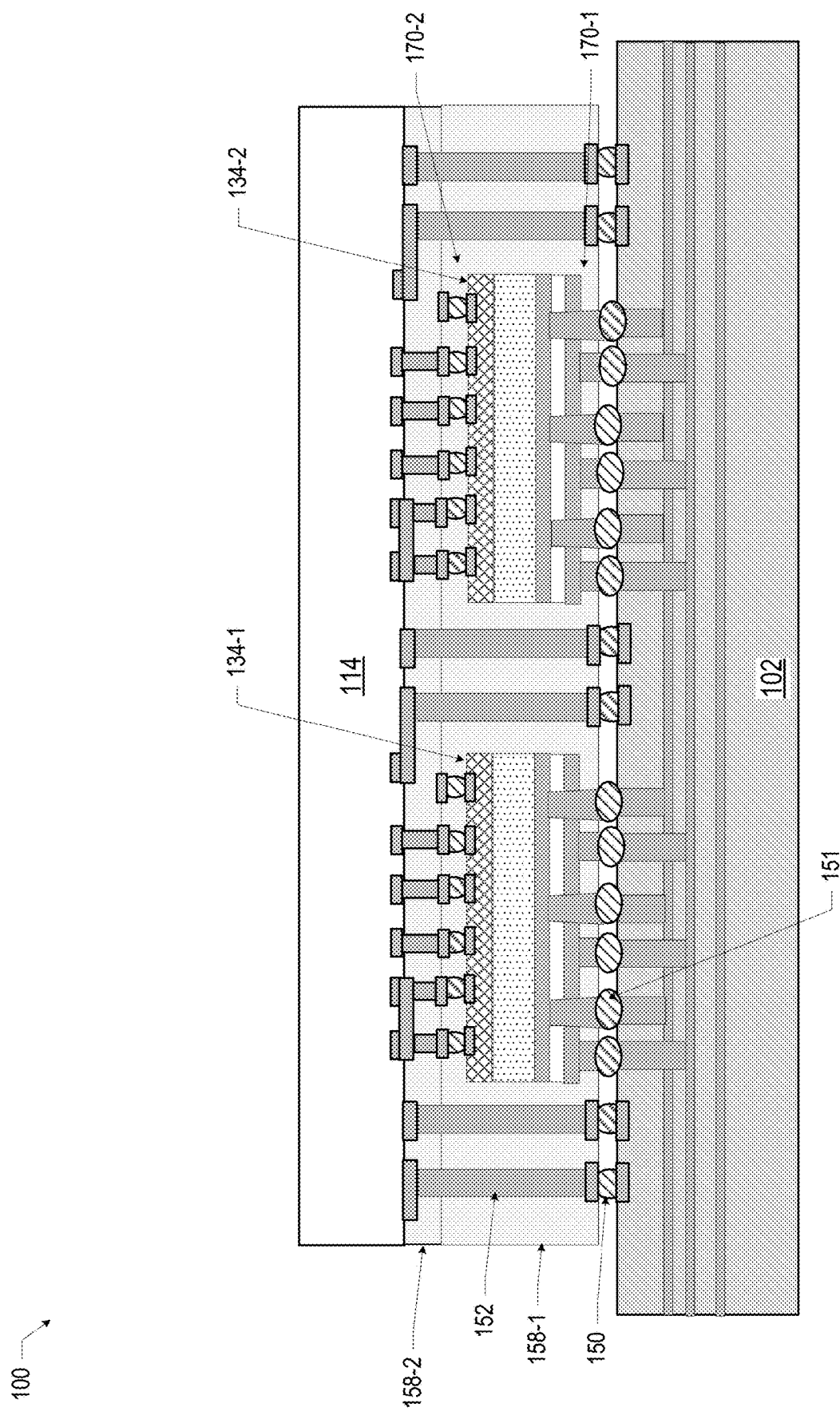
FIGS. 4A-4C are side, cross-sectional views of example microelectronic assemblies, in accordance with various embodiments.

FIG. 4A is a side, cross-sectional view of another example microelectronic assembly 100, in accordance with various embodiments. The microelectronic assemblies 100 disclosed herein may include a redistribution layer (RDL) 158. For example, FIG. 4A illustrates an embodiment of a microelectronic assembly 100 in which a first RDL 158-1 is between a die 114 and a package substrate 102, where a chiplet 134 is in the RDL 158-1, and a second RDL 158-2 is between the second surface 170-2 of the chiplet 134 and the die 114. The first RDL 158-1 may further include conductive pillars 152 to couple the die 114 to the package substrate 102. The second RDL 158-2 may include conductive pathways to couple the die 114 to the chiplet 134 and to the package substrate 102. The RDL 158 may be formed using any suitable technique, such as any of the techniques discussed below with reference to FIG. 7. Although FIG. 4A shows a particular number and arrangement of RDLs and conductive pathways, these are simply illustrative, and a microelectronic assembly 100 may have any suitable number RDLs and any suitable arrangement of conductive pillars and pathways.

Figure 4B:
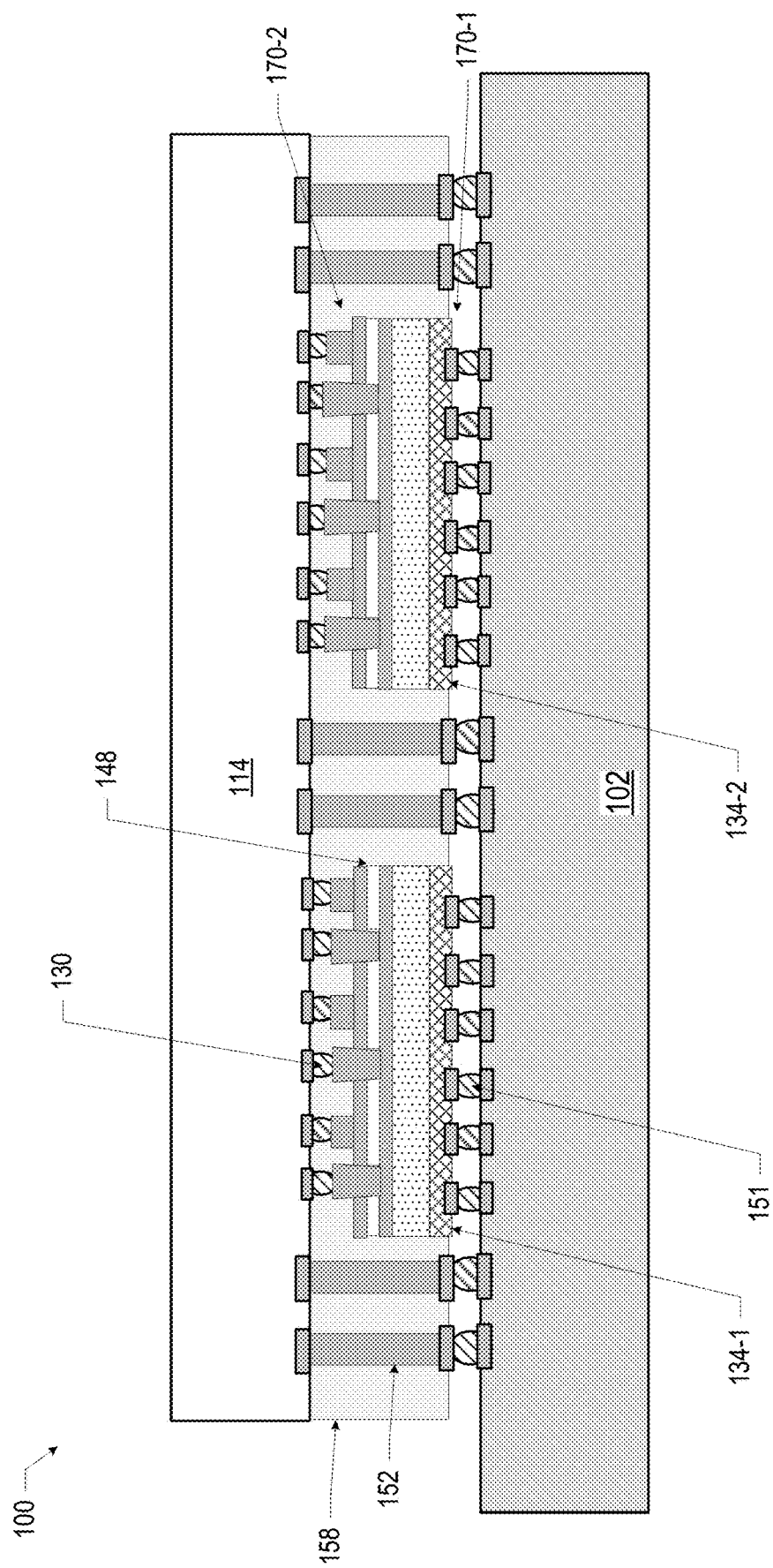

FIG. 4B is a side, cross-sectional view of another example microelectronic assembly 100, in accordance with various embodiments. A microelectronic assembly 100 may include one or more chiplets 134-1, 134-2 having IVR components in a "flipped" orientation, such that a capacitor layer 148 is coupled to a die 114 via DTC interconnects 130 and an active layer 115 of the chiplet 134 is coupled to a package substrate 102 via CTPS interconnects 151. In some embodiments, where the chiplet 134 is in a "flipped" orientation, the capacitor layer 148 may be a first capacitor layer and the chiplet 134 may include a second capacitor layer on the active layer 115 of the die 114 (e.g., adjacent the package substrate), such that the second capacitor layer may function as an input capacitor (e.g., input capacitor 144 of FIG. 2) and the first capacitor layer may function as an output capacitor (e.g., 1466 of FIG. 2).

Figure 4C:
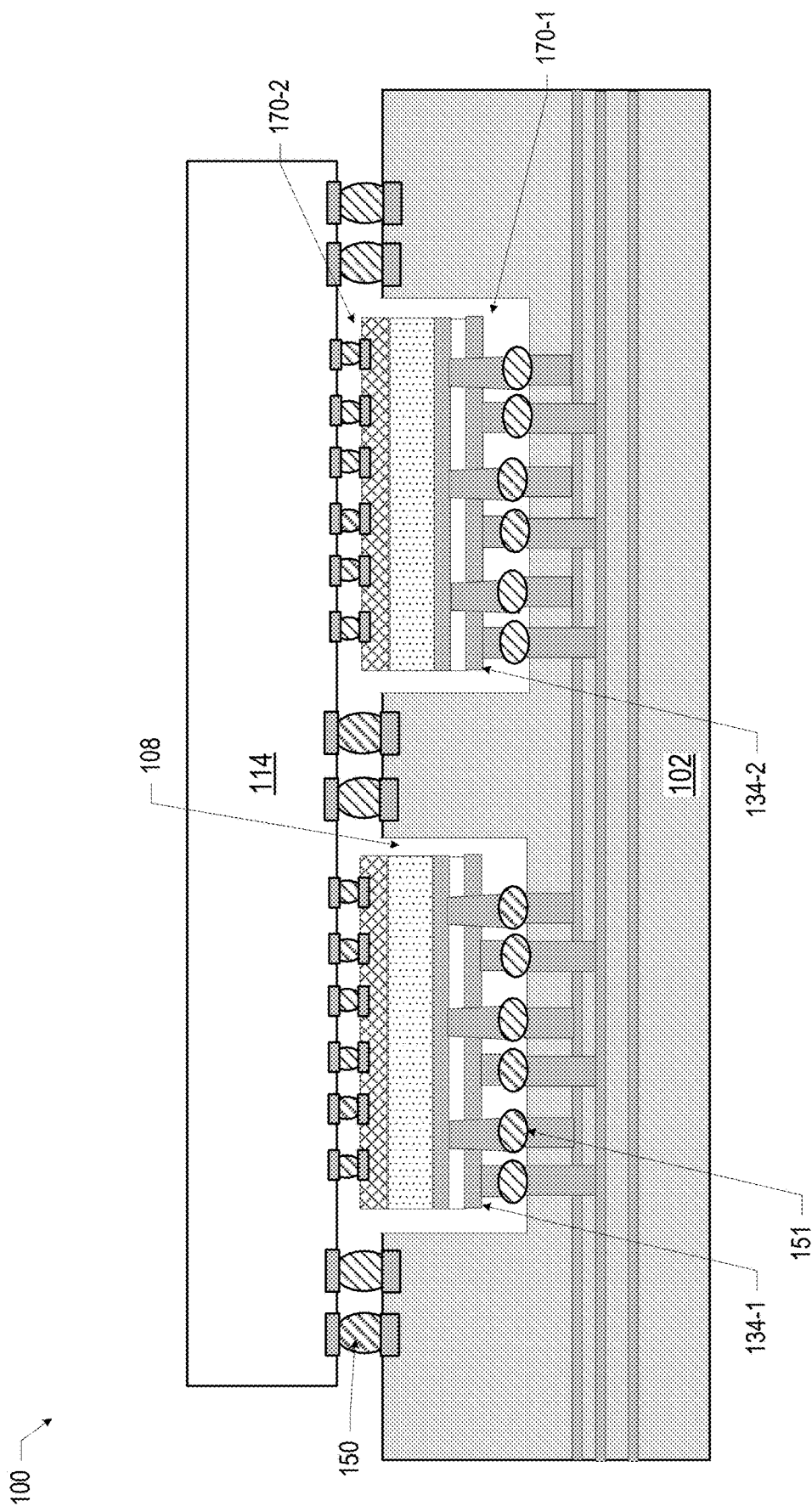

FIG. 4C is a side, cross-sectional view of another example microelectronic assembly 100, in accordance with various embodiments. The microelectronic assembly 100 may include a chiplet 134 having IVR components coupled to a package substrate 102 on a first surface 170-1 and coupled to a die 114 on a second surface 170-2. In particular, the top surface (e.g., at the first surface 170-1 of the chiplet 134) of the package substrate 102 includes a recess 108 in which the chiplet 134 is at least partially disposed. The bottom surface of the recess 108 may include conductive contacts to which the chiplet 134 is coupled via CTPS interconnects 151. The die 114 may be coupled to the package substrate 102 via FLI interconnects 150.

Any suitable techniques may be used to manufacture the chiplets 134 disclosed herein. For example, FIGS. 5A-5F are side, cross-sectional views of various stages in an example process for manufacturing the chiplet 134 of FIG. 1A, in accordance with various embodiments. Although the operations discussed below with reference to FIGS. 5A-5F (and others of the accompanying drawings representing manufacturing processes) are illustrated in a particular order, these operations may be performed in any suitable order. Additionally, although particular chiplets are illustrated in FIGS. 5A-5F (and others of the accompanying drawings representing manufacturing processes), the operations discussed below with reference to FIGS. 5A-5F may be used to form any suitable chiplets.

Figure 5A:
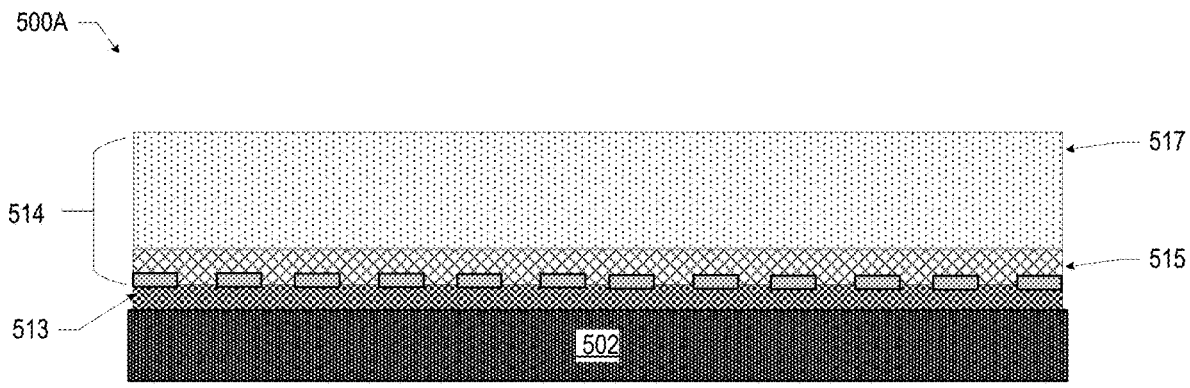
FIGS. 5A-5F are side, cross-sectional views of various stages in an example process for manufacturing a chiplet, in accordance with various embodiments.

FIG. 5A illustrates an assembly 500A including a carrier 502 on which an active wafer 514 is disposed. The active wafer 514 may include an active layer 515 facing the carrier 502 and an inactive layer 517 facing away from the carrier 502. The carrier 502 may include any suitable material for providing mechanical stability during manufacturing operations. The active wafer 514 may be attached to the carrier 502 using any suitable technique, including a temporary adhesive layer 513 or a die attach film (DAF).

Figure 5B:
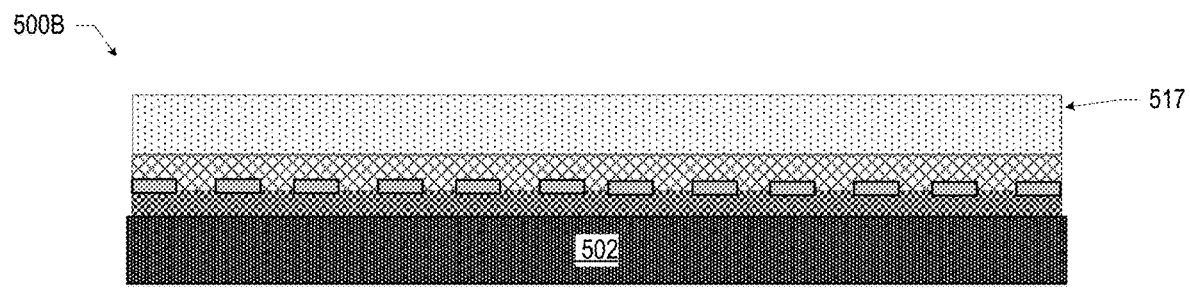

FIG. 5B illustrates an assembly 50013 subsequent to removing non-electrical material from the inactive layer 517 of the wafer 514. In some embodiments, the top surface of the inactive layer 517 may be polished. The non-electrical material, which is an inactive portion of the wafer 514, may include silicon, germanium, indium antimonide, lead telluride, indium arsenide, indium phosphide, gallium arsenide, gallium antimonide, further materials classified as group III-V, or an insulating material, such as silicon dioxide (glass), ceramic, or quartz, among other materials. The inactive material may be removed using any suitable technique, including, for example, grinding, etching, such as reactive ion etching (RIE) or chemical etching.

Figure 5C:
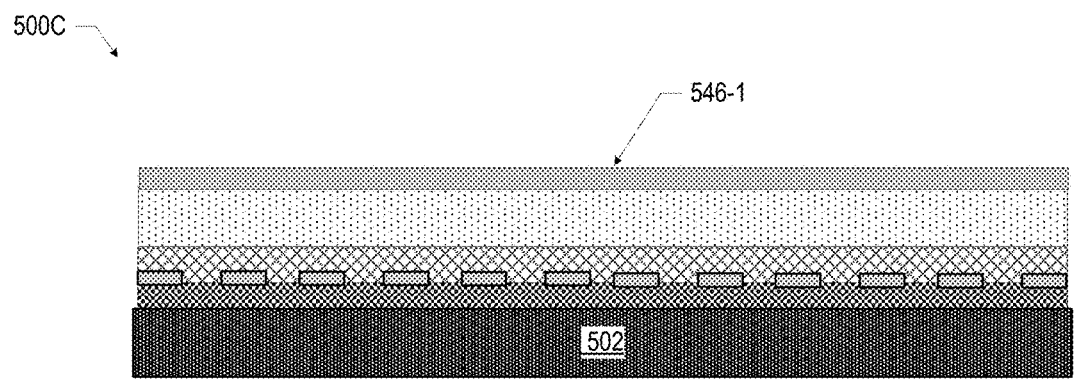

FIG. 5C illustrates an assembly 500C subsequent to forming a first metal layer 546-1 of a MIM capacitor on the top surface of the inactive layer 517. The first metal layer 546-1 may be formed by depositing conductive material using any suitable process, such as electroplating, sputtering, or electroless plating. The conductive material may be any suitable material, such as copper, silver, aluminum or titanium. In some embodiments, a seed layer (not shown) may be formed on the top surface of the inactive layer 517 prior to depositing the conductive material. The seed layer may be any suitable conductive material, including copper. In some embodiments, the seed layer may be omitted. In some embodiments, a barrier layer (not shown) may be formed on the top surface of the inactive layer 517 prior to depositing the first metal layer 546-1. The barrier layer may include any suitable material, such as silicon nitride, silicon dioxide, tantalum, or tantalum nitride, among others. In some embodiments, the barrier layer may be omitted.

Figure 5D:
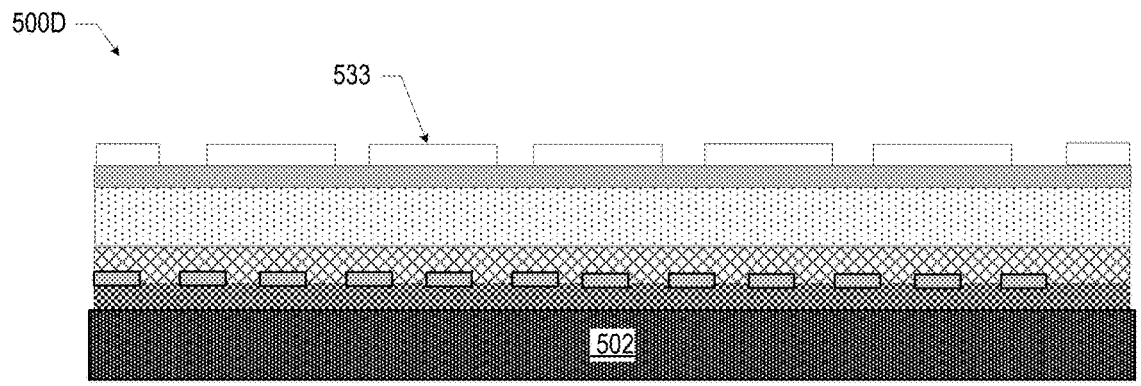

FIG. 5D illustrates an assembly 500D subsequent to depositing and patterning an insulating material layer 533 on the top surface of the first metal layer 546-1. The insulating material layer 533 may be formed and patterned over the first metal layer 546-1 using any suitable process, including a photoresist process, lamination, slit coating and curing, sputtering or sputtering followed by thermal or laser annealing. In some embodiments, a photo-imageable dielectric (PID) may be deposited by lamination and patterned by exposure to light. In some embodiments, a non-photodefinable material may be used in place of the PID, such as a dielectric mask, and removed, for example, using RIE or wet etching. The insulating material layer 533 may be formed of any suitable insulating material. In some embodiments, the insulating material layer 533 is a dielectric material. In some embodiments, a high-k dielectric material and/or thin dielectric layers may be formed on the top surface of the first metal layer 546-1 to maximize capacitance density. In some embodiments, the dielectric material may include titanium oxide, aluminum oxide, hafnium oxide, barium titanate, barium strontium titanate, lead zirconium titanate, zirconium silicate or zirconium oxide. In some embodiments, the dielectric material may include an organic dielectric material such as BT resin, polyimide materials, or a resin doped with high-k inorganic fillers.

Figure 5E:
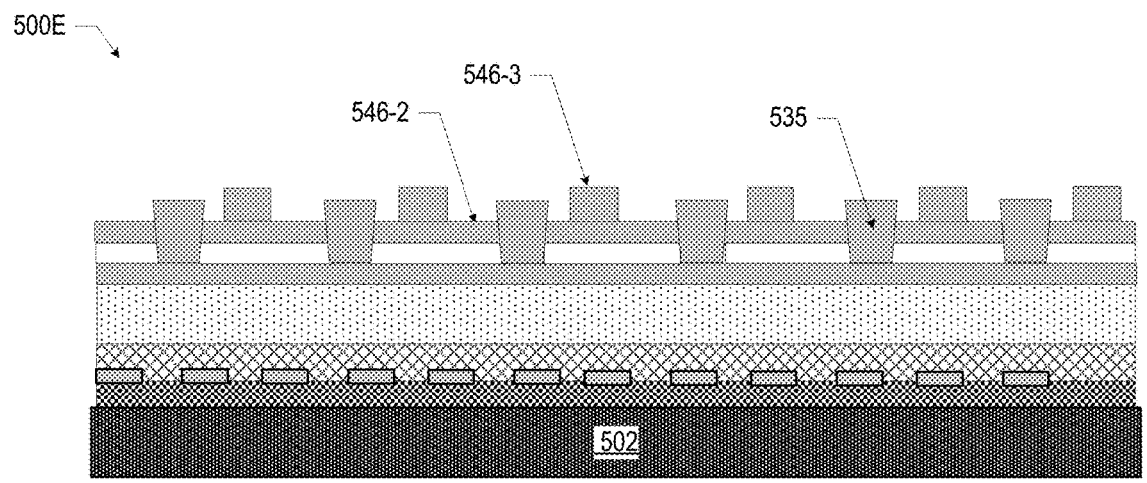

FIG. 5E illustrates an assembly 500E subsequent to depositing a second metal layer 546-2 to form a MIM capacitor on the top surface of the insulating material layer 533. The second metal layer 546-2 may be formed of any suitable conductive material, such as copper, silver, aluminum or titanium. The second metal layer 546-2 may be formed over the insulating material layer 533 using any suitable technique, for example, electroplating, sputtering, or electroless plating. The conductive vias 535 may form the external connections to electrically couple the first metal layer 546-1 to a package substrate 102 or to a die 114, as shown in FIG. 4. A third metal layer 546-3 may be deposited on the second metal layer 546-2 to form conductive contacts (e.g., conductive contacts 125, 127 of FIG. 1) for coupling to a package substrate 102 or a die 114. The second and third metal layers 546-2, 546-3 may be formed using one or more suitable processes, and the processed employed may depend on the process used to form the insulating material layer 533. For example, when a thin dielectric material is deposited, the vias may be formed by lithographically etching the dielectric material and then depositing the conductive material. In another example, when a lamination process is used to deposit the insulating material layer, the vias may be created using laser ablation. In some embodiments, the vias may be formed prior to forming the insulating material layer 533 by depositing, exposing, and developing a photoresist layer on the top surface of the first metal layer 546-1. The photoresist layer may be patterned to form cavities in the shape of the conductive vias 535. Conductive material, such as copper, may be deposited in the openings in the patterned photoresist layer to form the conductive vias 535. The conductive material may be deposited using any suitable process, such as electroplating, sputtering, or electroless plating. The photoresist may be removed to expose the conductive vias 535. The insulating material layer 533 may be deposited over the conductive vias 535 using, for example, a lamination process, and, if the insulating material is deposited to cover the top surface of the conductive vias 535, the insulating material layer 533 may be removed by any suitable technique, such as polishing or grinding to exposing the top surface of the conductive vias 535 prior to forming the second metal layer 546-2.

Figure 5F:
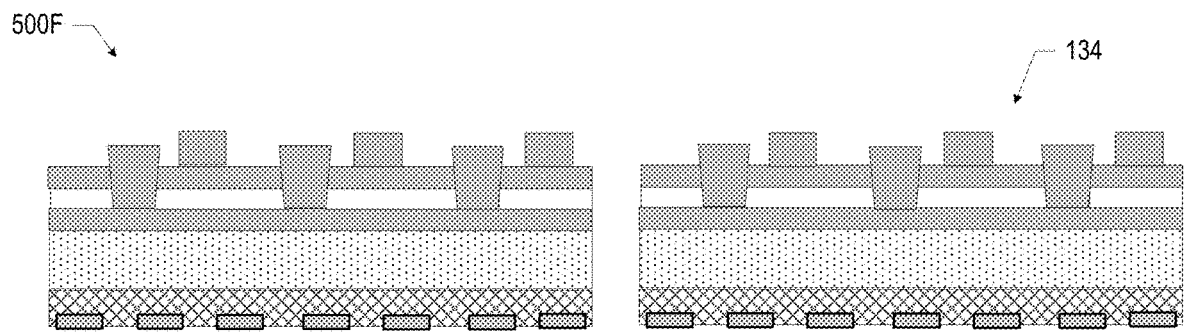

FIG. 5F illustrates an assembly 500F subsequent to removal of the carrier 502, and singulating into individual chiplets 134. If multiple chiplets are manufactured together, the chiplets may be singulated after removal of the carrier 502. Further operations may be performed as suitable either before or after singulating (e.g., depositing a solder resist layer, attaching solder balls for coupling to a die or a package substrate, etc.).

Figure 6C:
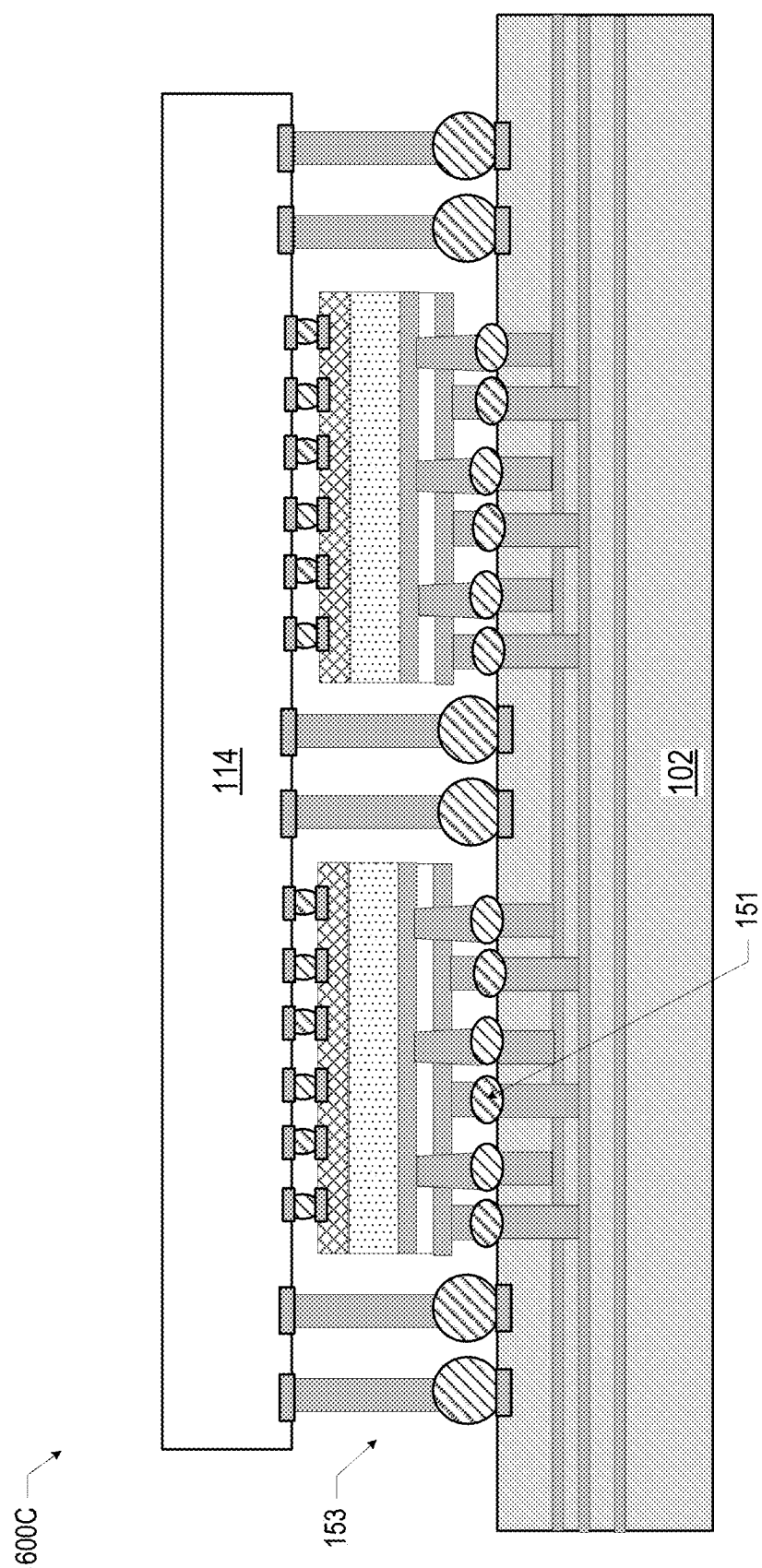

FIGS. 6A-6C are side, cross-sectional views of various stages in an example process for manufacturing the microelectronic assembly 100 of FIG. 1A, in accordance with various embodiments. Although the operations discussed below with reference to FIGS. 6A-6C (and others of the accompanying drawings representing manufacturing processes) are illustrated in a particular order, these operations may be performed in any suitable order. Additionally, although particular assemblies are illustrated in FIGS. 6A-6C (and others of the accompanying drawings representing manufacturing processes), the operations discussed below with reference to FIGS. 6A-6C may be used to form any suitable assemblies.

FIG. 6A illustrates an assembly 600A subsequent to forming conductive pillars 152 on the surface of a die 114. The conductive pillars 152 may take the form of any of the embodiments disclosed herein, and may be formed using any suitable technique. For example, the conductive pillars 152 may be formed by depositing, exposing, and developing a photoresist layer on the surface of the die 114. The photoresist layer may be patterned to form cavities in the shape of the conductive pillars. Conductive material, such as copper, may be deposited in the openings in the patterned photoresist layer to form the conductive pillars 152. The conductive material may be depositing using any suitable process, such as electroplating, sputtering, or electroless plating. The photoresist may be removed to expose the conductive pillars 152. In another example, a PID may be used to form the conductive pillars 152. The conductive pillars may have any suitable dimensions and shape, as described above with reference to FIG. 1.

FIG. 6B illustrates an assembly 600B subsequent to coupling a chiplet 134 to the die 114. One or more chiplets 134 may be coupled to a die via DTC interconnects 130.

FIG. 6C illustrates an assembly 600C subsequent to flipping the assembly 600B, and coupling to a package substrate 102 via DTPS interconnects 153 and CTPS interconnects 151. Further operations may be performed as suitable either before or after singulating (e.g., depositing a mold material, attaching a heat spreader, depositing a solder resist layer, attaching solder balls for coupling to a package substrate or to a circuit board, etc.). In other embodiments, a mold material may be disposed on top of the assembly 600B, cured, and, then, ground down to reveal the top interconnects FIGS. 7A-7D are side, cross-sectional views of various stages in an example process for manufacturing the microelectronic assembly 100 of FIG. 4A including an RDL, in accordance with various embodiments. FIG. 7A illustrates an assembly 700A subsequent to forming an RDL 158 on a die 114. The RDL 158 may include conductive pathways (e.g., traces and vias) for coupling a chiplet to a die and may allow for using a same IVR in chiplet in multiple applications and may improve power routing to the die 114. The RDL 158 may be manufactured using any suitable technique, such as a PCB technique or a redistribution layer technique. The conductive pillars 152 may be formed on the top surface of the RDL. The conductive pillars 152 may take the form of any of the embodiments disclosed herein, and may be formed using any suitable technique. For example, the conductive pillars 152 may be formed by depositing, exposing, and developing a photoresist layer on the surface of the die 114. The photoresist layer may be patterned to form cavities in the shape of the conductive pillars. Conductive material, such as copper, may be deposited in the openings in the patterned photoresist layer to form the conductive pillars 152. The conductive material may be depositing using any suitable process, such as electroplating, sputtering, or electroless plating. The photoresist may be removed to expose the conductive pillars 152. In another example, a PID may be used to form the conductive pillars 152. The conductive pillars may have any suitable dimensions and shape, as described above with reference to FIG. 4.

FIG. 7B illustrates an assembly 700B subsequent to coupling a chiplet 134 to the RDL 158 on the die 114. One or more chiplets 134 may be coupled to a die via DTC interconnects 130.

FIG. 7C illustrates an assembly 700C subsequent to providing an insulating material 430 around the chiplets 134 and the conductive pillars 152 of the assembly 700B (FIG. 7B). In some embodiments, the insulating material 430 may be initially deposited on and over the tops of the chiplets 134 and the conductive pillars 152, then, polished back to expose the conductive contacts at the top surface of the chiplets 134 and the top surfaces of the conductive pillars 152. In some embodiments, the insulating material 430 is a mold material, such as an organic polymer with inorganic silica particles. In some embodiments, the insulating material 430 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The dielectric material may be formed using any suitable process, including lamination, or slit coating and curing. If the dielectric layer is formed to completely cover the chiplets 134 and the conductive pillars 152, the dielectric layer may be removed to expose the conductive contacts at the top surface of the chiplets 134 and the top surfaces of the conductive pillars 152 using any suitable technique, including grinding, or etching, such as a wet etch, a dry etch (e.g., a plasma etch), a wet blast, or a laser ablation (e.g., using excimer laser). In some embodiments, the thickness of the insulating material 430 may be minimized to reduce the etching time required.

FIG. 7D illustrates an assembly 700D subsequent to flipping the assembly 700C, and coupling to a package substrate 102 via FLIs 150 and CTPS interconnects 151. Further operations may be performed as suitable either before or after singulating (e.g., depositing a mold material, attaching a heat spreader, depositing a solder resist layer, attaching solder balls for coupling to a package substrate or to a circuit board, etc.).

The microelectronic assemblies 100 disclosed herein may be used for any suitable application. For example, in some embodiments, a microelectronic assembly 100 may be used to enable very small form factor voltage regulation for field programmable gate array (FPGA) or processing units (e.g., a central processing unit, a graphics processing unit, a FPGA, a modem, an applications processor, etc.) especially in mobile devices and small form factor devices. In another example, the die 114 in a microelectronic assembly 100 may be a processing device (e.g., a central processing unit, a graphics processing unit, a FPGA, a modem, an applications processor, etc.).

The microelectronic assemblies 100 disclosed herein may be included in any suitable electronic component. FIGS. 8-11 illustrate various examples of apparatuses that may include, or be included in, any of the microelectronic assemblies 100 disclosed herein.

Figure 8:
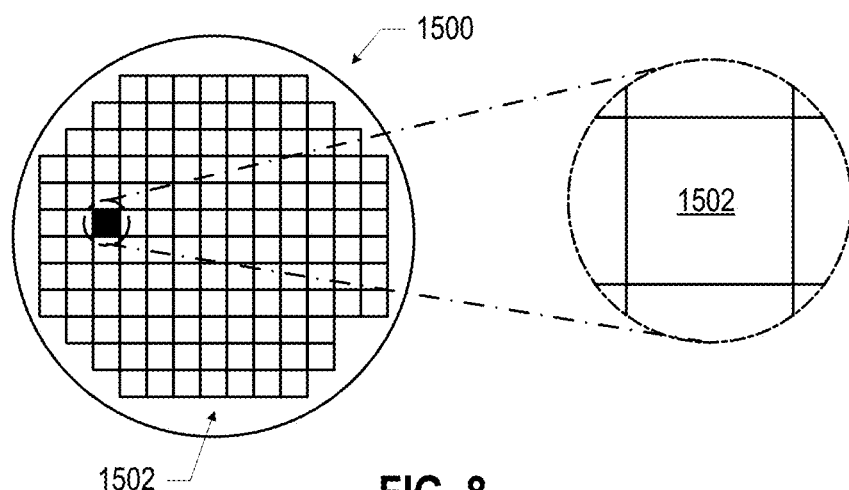
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 9, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array. In some embodiments, a die 1502 (e.g., a die 114) may be a central processing unit, a radio frequency chip, a power converter, or a network processor. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 9:
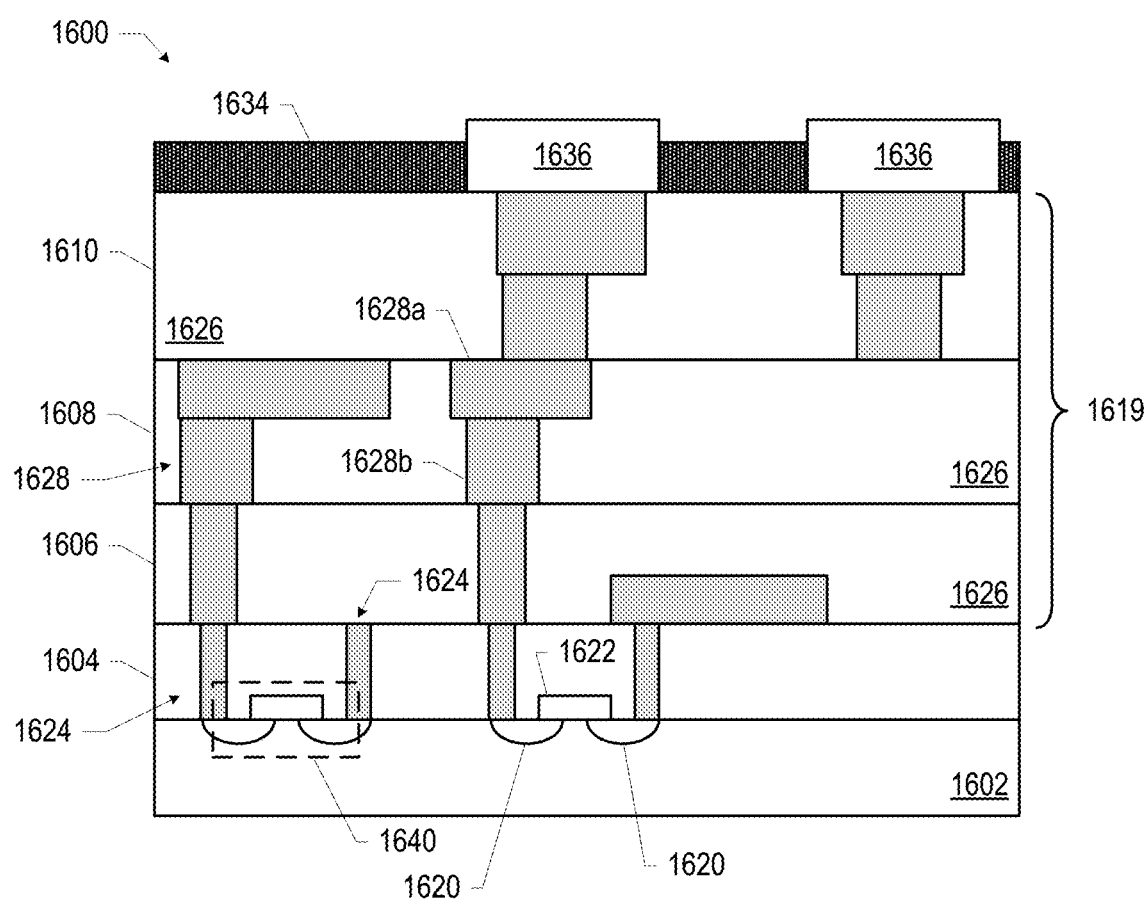
FIG. 9 is a cross-sectional side view of an IC device that may be included in a microelectronic assembly, in accordance with any of the embodiments disclosed herein.

FIG. 9 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 8). The IC device 1600 may be formed on a die substrate 1602 (e.g., the wafer 1500 of FIG. 8) and may be included in a die (e.g., the die 1502 of FIG. 8). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 8) or a wafer (e.g., the wafer 1500 of FIG. 8).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 9. Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 9. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 10:
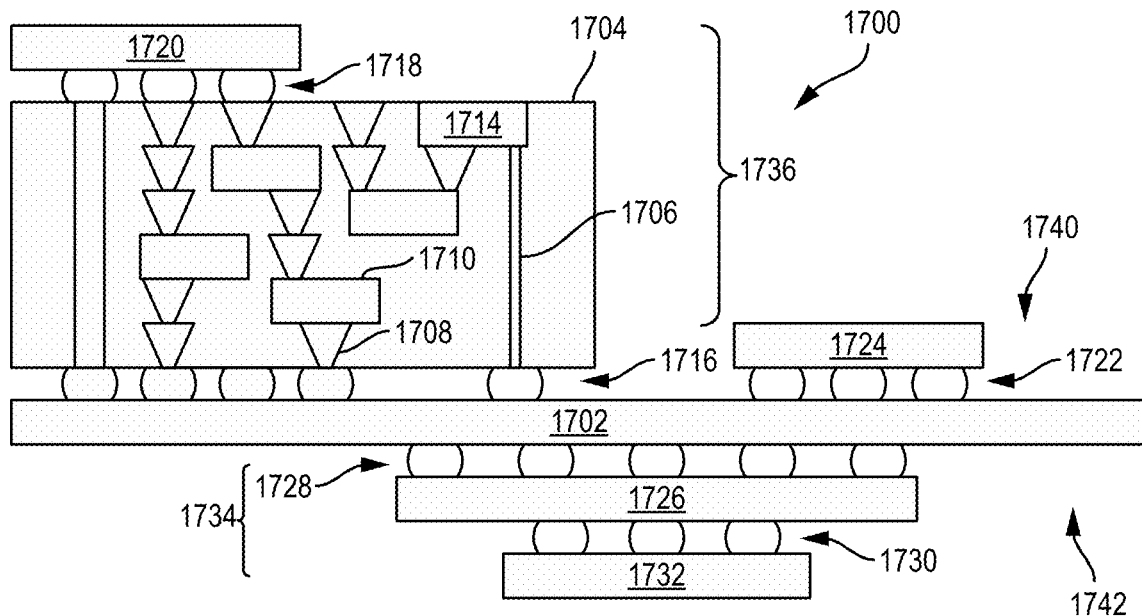
FIG. 10 is a cross-sectional side view of an IC device assembly that may include a microelectronic assembly, in accordance with any of the embodiments disclosed herein.

FIG. 10 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
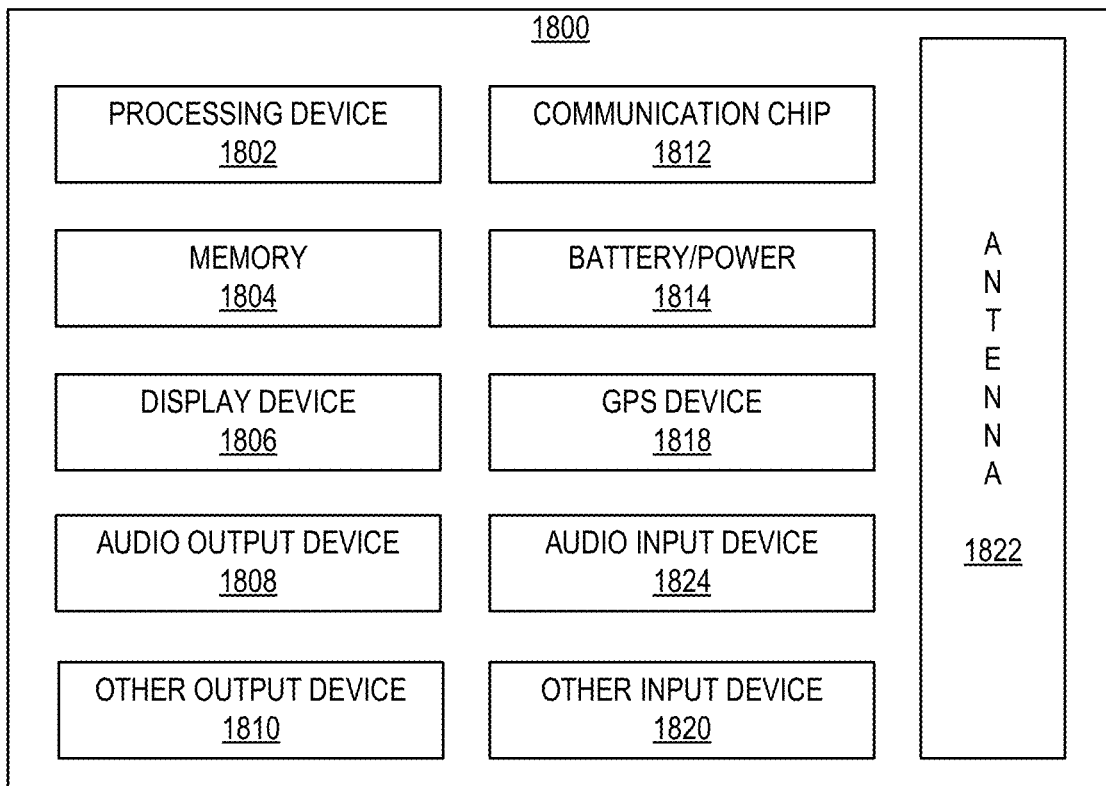
FIG. 11 is a block diagram of an example electrical device that may include a microelectronic assembly, in accordance with any of the embodiments disclosed herein.

FIG. 11 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic assembly, including: a package substrate having a surface; a die having a first surface and an opposing second surface; and a chiplet having a first surface and an opposing second surface, wherein the chiplet is between the surface of the package substrate and the first surface of the die, the first surface of the chiplet is coupled to the surface of the package substrate and the second surface of the chiplet is coupled to the first surface of the die, and wherein the chiplet includes: a capacitor at the first surface; and an element at the second surface, wherein the element includes a switching transistor or a diode.

Example 2 may include the subject matter of Example 1, the package substrate further includes a power plane, and may further specify that the capacitor is electrically coupled to the power plane in the package substrate.

Example 3 may include the subject matter of Example 1, and may further specify that the capacitor is a metal-insulator-metal (MIM) capacitor.

Example 4 may include the subject matter of Example 3, and may further specify that the MIM capacitor is a multilayer capacitor.

Example 5 may include the subject matter of Example 1, and may further specify that the first surface of the die is coupled to the surface of the package substrate by first interconnects, the package substrate further includes an inductor, and the element is coupled to the inductor in the package substrate via the first interconnects.

Example 6 may include the subject matter of Example 1, and may further specify that the chiplet further includes a plurality of through silicon vias (TSVs).

Example 7 may include the subject matter of Example 6, and may further specify that the plurality of TSVs electrically couple the first surface of the die to the surface of the package substrate.

Example 8 may include the subject matter of Example 1, and may further include: a redistribution layer (RDL) between the surface of the package substrate and the first surface of the die, and may further specify that the chiplet is in the RDL.

Example 9 may include the subject matter of Example 1, and may further specify that the chiplet is at least partially in a recess in the package substrate.

Example 10 may include the subject matter of Example 1, and may further specify that the die is a central processing unit, a graphics processing unit, a digital signal processor, an application specific integrated circuit, a server processor, or a crypto processor.

Example 11 may include the subject matter of Example 1, and may further specify that the die includes a core, and that the chiplet is electrically coupled to the core.

Example 12 may include the subject matter of Example 1, and may further specify that the die includes a first core and a second core, and that the chiplet is electrically coupled to the first core and the second core.

Example 13 may include the subject matter of Example 1, and may further specify that the die includes a first core and a second core, that the chiplet is a first chiplet and the second surface of the first chiplet is electrically coupled to the first core of the die, and that the microelectronic assembly further includes: a second chiplet having a first surface and an opposing second surface, that the second chiplet is between the surface of the package substrate and the first surface of the die, that the first surface of the second chiplet is electrically coupled to the surface of the package substrate and the second surface of the second chiplet is electrically coupled to the second core of the die, and that the second chiplet includes a capacitor at the first surface and an element at the second surface, wherein the element includes a switching transistor or a diode.

Example 14 is a microelectronic assembly, including: a package substrate having a surface; a die having a first surface and an opposing second surface; and a chiplet, having a first surface and an opposing second surface, between the package substrate and the die, wherein the chiplet includes: an element at the first surface, wherein the element is coupled to the surface of the package substrate via first interconnects, and wherein the element includes a switching transistor or a diode; and a metal-insulator-metal (MIM) capacitor at the second surface, wherein the MIM capacitor is coupled to the first surface of the die via second interconnects.

Example 15 may include the subject matter of Example 14, and may further specify that the package substrate includes a power plane and a ground plane, and that the element is electrically coupled to the power plane and to the ground plane via conductive pathways in the package substrate.

Example 16 may include the subject matter of Example 14, and may further specify that the package substrate includes an inductor, and that the element is coupled to the inductor via a conductive pathway in the package substrate.

Example 17 may include the subject matter of Example 14, and may further specify that the die includes: a control circuit.

Example 18 may include the subject matter of Example 14, and may further specify that the first surface of the chiplet further includes: a MIM capacitor.

Example 19. An integrated voltage regulator (IVR) chiplet, including: an active layer, having a first surface and an opposing second surface, wherein the active layer includes a first switching transistor and a second switching transistor; and a backside layer on the second surface of the active layer, wherein the backside layer includes a capacitor.

Example 20 may include the subject matter of Example 19, and may further specify that the capacitor is a metal-insulator-metal (MIM) capacitor.

Example 21 may include the subject matter of Example 20, and may further specify that the MIM capacitor includes a high-k dielectric material.

Example 22 may include the subject matter of Example 21, and may further specify that the high-k dielectric material includes a piezoelectric material.

Example 23 may include the subject matter of Example 21, and may further specify that the high-k dielectric material includes one or more of: lead zirconate titanate and barium titanate.

Example 24 may include the subject matter of Example 19, and may further include: a control circuit.

Example 25 may include the subject matter of Example 19, and may further specify that the first switching transistor is a p-type metal oxide semiconductor transistor, and that the second switching transistor is an n-type metal oxide semiconductor transistor.

Example 26 may include the subject matter of Example 19, and may further include: an inductor.

Example 27 may include the subject matter of Example 26, and may further specify that the inductor is a thin film magnetic core inductor.

Example 28 may include the subject matter of Example 19, and may further specify that the capacitor is a first capacitor, and the active layer of the IVR chiplet further includes: a second capacitor.

Example 29 may include the subject matter of Example 19, and may further include: a plurality of through silicon vias.

Example 30 is a method of manufacturing an IVR chiplet, including: removing a material from a backside surface of a die, wherein the die has an active surface and the backside surface that is opposite the active surface; forming a capacitor on a backside surface of a die; forming a first conductive pathway from the backside surface of the die to a first plate of the capacitor; and forming a second conductive pathway from the backside surface of the die to a second conductive plate of the capacitor.

Example 31 may include the subject matter of Example 30, and may further specify that forming the capacitor includes: forming a first conductive layer; forming and patterning a dielectric layer on the first conductive layer; and forming a second conductive layer on the dielectric layer.

Example 32 may include the subject matter of Example 31, and may further specify that the dielectric layer includes a high-k dielectric material.

Example 33 may include the subject matter of Example 31, and may further specify that the first conductive layer or the second conductive layer includes copper.

Example 34 may include the subject matter of Example 30, and may further specify that the die includes gallium nitride, gallium arsenide, indium phosphide, silicon, or germanium.

Example 35 is a method of manufacturing a microelectronic assembly, including: forming an IVR chiplet, wherein the IVR chiplet is formed by forming a capacitor on a backside surface of a wafer, wherein the wafer has an active surface including a switching transistor or a diode and the backside surface opposes the active surface; forming first interconnects between the IVR chiplet and a package substrate, wherein the IVR chiplet has a first surface with first conductive contacts and an opposing second surface with second conductive contacts, wherein the package substrate has a surface with conductive contacts, and wherein the first interconnects couple the conductive contacts on the package substrate to the first conductive contacts on the IVR chiplet; and forming second interconnects between the IVR chiplet and a die, wherein the die has a surface with conductive contacts, and wherein the second interconnects couple the conductive contacts of the die to the second conductive contacts of the IVR chiplet.

Example 36 may include the subject matter of Example 35, and may further specify that the first surface of the IVR chiplet is the backside surface having the capacitor and the second surface of the IVR chiplet is the active surface.

Example 37 may include the subject matter of Example 36, and may further specify that first interconnects couple the capacitor of the IVR chiplet to a power plane in the package substrate.

Example 38 may include the subject matter of Example 36, and may further specify that the second interconnects couple the switching transistor or the diode of the IVR chiplet to the die.

Example 39 may include the subject matter of Example 35, and may further specify that the first surface of the IVR chiplet is the active surface having the switching transistor or the diode and the second surface of the IVR chiplet is the backside surface having the capacitor.

Example 40 may include the subject matter of Example 39, and may further specify that the first interconnects couple the switching transistor or the diode of the IVR chiplet to a power plane in the package substrate.

Example 41 may include the subject matter of Example 39, and may further specify that the second interconnects couple the capacitor of the IVR chiplet to the die.

The invention claimed is:

1. A microelectronic assembly, comprising:
a package substrate having a surface;
a die having a first surface and an opposing second surface, wherein the first surface of the die is coupled to the surface of the package substrate by first interconnects;
a chiplet, having a third surface and an opposing fourth surface, between the surface of the package substrate and the first surface of the die, wherein the first interconnects are between the surface of the package substrate and the first surface of the die and adjacent to the chiplet, and wherein the chiplet includes:
an element at the third surface of the chiplet, wherein the element is coupled to the surface of the package substrate by second interconnects between the surface of the package substrate and the third surface of the chiplet, and wherein the element includes a switching transistor or a diode; and
a capacitor at the fourth surface of the chiplet, wherein the capacitor is coupled to the first surface of the die by third interconnects.

2. The microelectronic assembly of claim 1, wherein the capacitor is a metal-insulator-metal (MIM) capacitor.

3. The microelectronic assembly of claim 2, wherein the MIM capacitor is a multi-layer capacitor.

4. The microelectronic assembly of claim 1, wherein the package substrate includes an inductor, and wherein the element is coupled to the inductor via a conductive pathway in the package substrate.

5. The microelectronic assembly of claim 1, wherein the die includes: a control circuit.

6. The microelectronic assembly of claim 1, wherein the die is a central processing unit, a graphics processing unit, a digital signal processor, an application specific integrated circuit, a server processor, or a crypto processor.

7. The microelectronic assembly of claim 1, wherein the capacitor is a first capacitor, and wherein the third surface of the chiplet further includes: a second capacitor.

* * * * *